United States Patent
Eslick et al.

(10) Patent No.: US 7,480,489 B2
(45) Date of Patent: Jan. 20, 2009

(54) WIRELESS DEVICE HAVING A DISTINCT HARDWARE ACCELERATOR TO SUPPORT DATA COMPRESSION PROTOCOLS DEDICATED TO GSM (V.42)

(75) Inventors: Ian Eslick, Cambridge, MA (US); Mike (Hon Fai) Chu, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 291 days.

(21) Appl. No.: 10/994,618

(22) Filed: Nov. 22, 2004

(65) Prior Publication Data

US 2006/0123308 A1    Jun. 8, 2006

(51) Int. Cl.
*H04B 1/00* (2006.01)
(52) U.S. Cl. .................. 455/72; 455/412.1
(58) Field of Classification Search .......... 455/72, 455/70, 333, 412.1, 466, 563
See application file for complete search history.

(56) References Cited

U.S. PATENT DOCUMENTS 6,961,011 B2 * 11/2005 Matthews .................. 341/87

OTHER PUBLICATIONS

Thornborson, The V.42bis Standard for Data-Comprssing Modems, Oct. 1992, IEEE, pp. 41-53.*

\* cited by examiner

*Primary Examiner*—Quochien B Vuong
(74) *Attorney, Agent, or Firm*—Garlick Harrison & Markison

(57) ABSTRACT

A processor within a wireless terminal performs data compression, decompression and error correction according to a data compression protocol such as the V.42bis data compression protocol used within GSM wireless networks. This processor includes an interface that receives incoming information or data to be compressed or decompressed according to the data compression protocol. A processing module within the processor is operably coupled to the interface to receive and process the incoming information. Instructions executed within the processing module will divide the processing responsibilities between the processing module and a data compression/decompression accelerator operably coupled to the processing module. Compute intensive operations may be offloaded from the processing module onto the data compression/decompression accelerator to improve overall system efficiency.

32 Claims, 14 Drawing Sheets

WIRELESS DEVICE HAVING A DISTINCT HARDWARE ACCELERATOR TO SUPPORT DATA COMPRESSION PROTOCOLS DEDICATED TO GSM (V.42)

BACKGROUND

1. Technical Field

The present invention relates generally to cellular wireless communication systems, and more particularly to a distinct hardware accelerator component to support error correction, compression and decompression within a wireless terminal of a cellular wireless communication system.

2. Related Art

Cellular wireless communication systems support wireless communication services in many populated areas of the world. While cellular wireless communication systems were initially constructed to service voice communications, they are now called upon to support data and video (multimedia) communications as well. The demand for video and data communication services has exploded with the acceptance and widespread use video capable wireless terminals and the Internet. Video and data communications have historically been serviced via wired connections; cellular wireless users now demand that their wireless units also support video and data communications. The demand for wireless communication system video and data communications will only increase with time. Thus, cellular wireless communication systems are currently being created/modified to service these burgeoning demands. Data compression is particularly useful in communications because it enables wireless providers to service additional wireless terminals by allowing the same information to be sent in fewer bits.

Cellular wireless networks include a "network infrastructure" that wirelessly communicates with wireless terminals within a respective service coverage area. The network infrastructure typically includes a plurality of base stations dispersed throughout the service coverage area, each of which supports wireless communications within a respective cell (or set of sectors). The base stations couple to base station controllers (BSCs), with each BSC serving a plurality of base stations. Each BSC couples to a mobile switching center (MSC). Each BSC also typically directly or indirectly couples to the Internet.

In operation, each base station communicates with a plurality of wireless terminals operating in its cell/sectors. A BSC coupled to the base station routes voice, video, data or multimedia communications between the MSC and a serving base station. The MSC then routes these communications to another MSC or to the PSTN. Typically, BSCs route data communications between a servicing base station and a packet data network that may include or couple to the Internet. Transmissions from base stations to wireless terminals are referred to as "forward link" transmissions while transmissions from wireless terminals to base stations are referred to as "reverse link" transmissions. The volume of data transmitted on the forward link typically exceeds the volume of data transmitted on the reverse link. Such is the case because data users typically issue commands to request data from data sources, e.g., web servers, and the web servers provide the data to the wireless terminals. The great number of wireless terminals communicating with a single base station forces the need to compress the communications and divide the forward and reverse link transmission times amongst the various wireless terminals.

Wireless links between base stations and their serviced wireless terminals typically operate according to one (or more) of a plurality of operating standards. These operating standards define the manner in which the wireless link may be allocated, setup, serviced and torn down. One popular cellular standard is the Global System for Mobile telecommunications (GSM) standard. The GSM standard, or simply GSM, is predominant in Europe and is in use around the globe. While GSM originally serviced only voice communications, it has been modified to also service data communications. GSM General Packet Radio Service (GPRS) operations and the Enhanced Data rates for GSM (or Global) Evolution (EDGE) operations coexist with GSM by sharing the channel bandwidth, slot structure, and slot timing of the GSM standard. GPRS operations and EDGE operations may also serve as migration paths for other standards as well, e.g., IS-136 and Pacific Digital Cellular (PDC).

The GSM standard specifies communications in a time divided format (in multiple channels). The GSM standard specifies a 4.615 ms frame that includes 8 slots of, each including eight slots of approximately 577 μs in duration. Each slot corresponds to a Radio Frequency (RF) burst. A normal RF burst, used to transmit information, typically includes a left side, a midamble, and a right side. The midamble typically contains a training sequence whose exact configuration depends on modulation format used. However, other types of RF bursts are known to those skilled in the art. Each set of four bursts on the forward link carry a partial link layer data block, a full link layer data block, or multiple link layer data blocks. Also included in these four bursts is control information intended for not only the wireless terminal for which the data block is intended but for other wireless terminals as well.

GPRS and EDGE include multiple coding/puncturing schemes and multiple modulation formats, e.g., Gaussian Minimum Shift Keying (GMSK) modulation or Eight Phase Shift Keying (8PSK) modulation. Particular coding/puncturing schemes and modulation formats used at any time depend upon the quality of a servicing forward link channel, e.g., Signal-to-Noise-Ratio (SNR) or Signal-to-Interference-Ratio (SIR) of the channel, Bit Error Rate of the channel, Block Error Rate of the channel, etc. As multiple modulation formats may be used for any RF burst, wireless communication systems require significant processing ability to encode and decode the information contained within the RF bursts. This decision may be further influenced by changing radio conditions and the desired quality level to be associated with the communications.

Data compression is the process of encoding data to reduce the required storage space or transmission time when compared to uncompressed data. This is possible because most real-world data is very redundant or not most concisely represented in its human-interpretable form. One means of compression, is run-length encoding, wherein large runs of consecutive identical data values are replaced by a simple code with the data value and length of the run. This is an example of lossless data compression, where data compresses in such a way that it can be recovered exactly. For symbolic data such as spreadsheets, text, executable programs, etc., loss-lessness is essential because changing even a single bit cannot be tolerated (except in some limited cases). Other kinds of data such as sounds and pictures, a small loss of quality can be tolerated without losing the essential nature of the data. These methods frequently offer a range of compression efficiencies, where the user can choose whether he wants highly-compressed data with noticeable loss of quality or higher-quality data with less compression. In particular, compression of images and sounds can take advantage of limitations of the human sensory system to compress data in ways that are lossy, but nearly indistinguishable from the original.

However, as wireless terminals are being required to transmit both symbolic data as well as data that can tolerate a small loss of quality without losing the essential nature of the data, lossless compression algorithms such as Lempel-Ziv (LZ) and Lempel-Ziv-Welch (LZW) compression methods are becoming increasing popular in their application to wireless terminals. These methods utilize a table based compression model where table entries are substituted for redundant data. For most methods, this table is generated dynamically from earlier data in the input. Psychoacoustics may be employed to remove non-audible components of the signal to make compression more efficient.

As software is becoming increasingly more powerful with improved microelectronic technologies providing new programmable processors, additional functionalities may be added. These include the application of multimedia content or visual information in a mobile connection. Already today wireless terminals are not limited to only voice communications. Other types of data including real time multimedia may be provided. The need for more efficient communications is much stronger when using a mobile wireless device and reinforces the relevance of compressed communications in a mobile environment. This requires that the communications be of an acceptable quality at low enough rates to be effectively communicated in the cellular wireless environment. However, to achieve low data rates often requires computer intense coding schemes.

These improved coding and decoding abilities create ever-growing demands on the processor within the wireless environment. Unlike a desktop computer coupled to a network via a landline connection a mobile wireless terminal will have a limited data rate between itself and the servicing base station. Additionally, the processors within the wireless terminal are assigned multiple processing duties. The increased coding and decoding associated with these compressed communications require additional processing power in order to maintain real time audio/visual communications. The addition of these processing requirements within the wireless terminal requires new methods with which to balance the processing requirements of the system processor while maintaining these real time audio/visual communications.

BRIEF SUMMARY OF THE INVENTION

In order to overcome the shortcomings of prior devices, the present invention provides a system and method of processing data that utilizes a distinct hardware accelerator to support compression and decompression within a wireless device.

More specifically, the present invention provides a processor within a wireless terminal operable to perform data compression, decompression and error correction according to a data compression protocol such as the V.42bis data compression protocol used within GSM wireless networks. This processor includes an interface that receives incoming information or data to be compressed or decompressed according to the data compression protocol. A processing module within the processor is operably coupled to the interface to receive and process the incoming information. Instructions executed within the processing module will divide the processing responsibilities between the processing module and a data compression/decompression accelerator operably coupled to the processing module. This allows compute intensive operations that relate to compression, decompression, and error correction to be performed by the accelerator. This allows the processing module of the wireless terminal to be more efficiently used for other processing tasks within the wireless terminal.

Another embodiment provides a wireless terminal that utilizes a distinct hardware accelerator to support compression, decompression and error correction operations. This wireless terminal includes a radio frequency (RF) front end, a baseband and/or system processor. The processor may include or interface with a processing module operable to perform data compression, decompression and error correction according to a data compression protocol such as the V.42bis data compression protocol used within GSM wireless networks. Instructions executed within the processing module will divide the processing responsibilities between the processing module and a data compression/decompression accelerator operably coupled to the processing module. Compute intensive operations that relate to compression, decompression, and error correction may then be performed by the accelerator. This allows the processing module, or system processor, of the wireless terminal to be more efficiently used for other processing tasks within the wireless terminal.

Yet another embodiment of the present invention provides a method by which information is processed within a wireless terminal. This method involves receiving information at a processing engine wherein the information is to be analyzed, compressed, decompressed, or error corrected. Next, the mode of operation of the processing engine is determined based on the information received. The processing of the information will be divided between processing module and a dedicated accelerator module wherein the accelerator module is configured based on the mode of operation and is operable to support compression, decompression and error correction operations.

Other features and advantages of the present invention will become apparent from the following detailed description of the invention made with reference to the accompanying drawings.

DETAILED DESCRIPTION OF THE DRAWINGS

Figure 1:
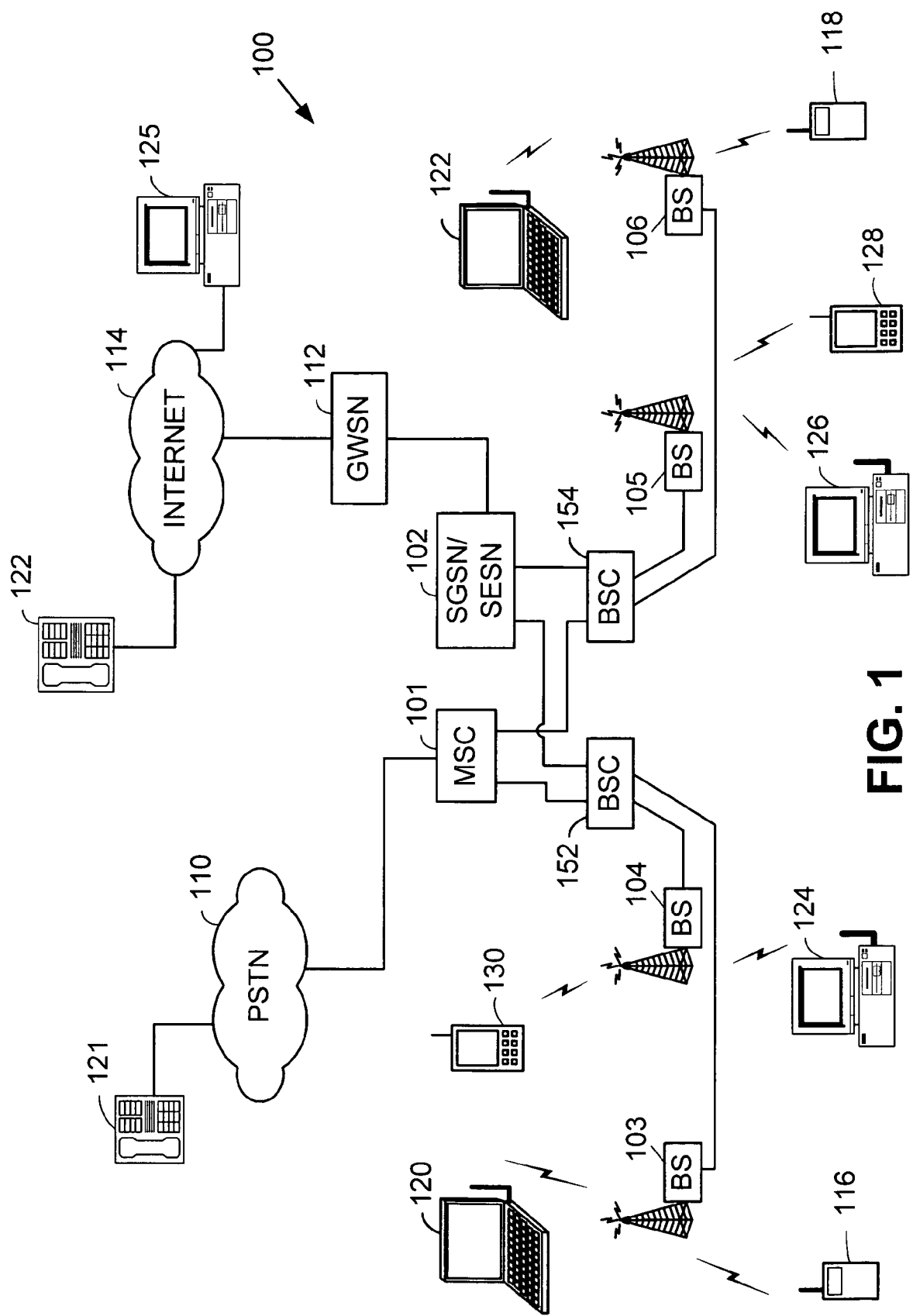
FIG. 1 is a system diagram illustrating a portion of a cellular wireless communication system that supports wireless terminals operating according to the present invention.

FIG. 1 is a system diagram illustrating a portion of a cellular wireless communication system 100 that supports wireless terminals operating according to the present invention. The cellular wireless communication system 100 includes a Mobile Switching Center (MSC) 101, Serving GPRS Support Node/Serving EDGE Support Node (SGSN/SESN) 102, base station controllers (BSCs) 152 and 154, and base stations 103, 104, 105, and 106. The SGSN/SESN 102 couples to the Internet 114 via a GPRS Gateway Support Node (GGSN) 112. A conventional multimedia capable terminal 121 couples to the PSTN 110. Multimedia capable terminal 123 and a personal computer 125 couple to the Internet 114. The MSC 101 couples to the Public Switched Telephone Network (PSTN) 110.

Each of the base stations 103-106 services a cell/set of sectors within which it supports wireless communications. Wireless links that include both forward link components and reverse link components support wireless communications between the base stations and their serviced wireless terminals. These wireless links support digital voice, video, multimedia, and data communications. Data compression allows an increase the total number of wireless terminals serviced by the base stations. The cellular wireless communication system 100 may also be backward compatible in supporting analog operations as well. The cellular wireless communication system 100 supports the Global System for Mobile telecommunications (GSM) standard and also the Enhanced Data rates for GSM (or Global) Evolution (EDGE) extension thereof. The cellular wireless communication system 100 may also support the GSM General Packet Radio Service (GPRS) extension to GSM. However, the present invention is also applicable to other standards as well, e.g., TDMA standards, CDMA standards, etc.

Wireless terminals 116, 118, 120, 122, 124, 126, 128, and 130 couple to the cellular wireless communication system 100 via wireless links with the base stations 103-106. As illustrated, wireless terminals may include video and multimedia capable cellular telephones 116 and 118, laptop computers 120 and 122, desktop computers 124 and 126, and data terminals 128 and 130. However, the wireless system supports communications with other types of wireless terminals as known to those skilled in the art as well. As is generally known, devices such as laptop computers 120 and 122, desktop computers 124 and 126, data terminals 128 and 130, and cellular telephones 116 and 118, are enabled to "surf" the Internet 114, transmit and receive data, audio and video communications. Many of these operations have significant download data-rate (forward link) requirements and upload data-rate (reverse link) requirements in order to support video and multimedia communications. Some or all of the wireless terminals 116-130 are therefore enabled to support the EDGE operating standard, the GSM standard and may support the GPRS standard.

Wireless terminals 116-130 support the pipelined processing of received RF bursts in slots of a GSM frame so that a plurality of slots in each sub-frame of a GSM frame are allocated for forward link transmissions to a single wireless terminal. In one embodiment, a number of slots of a GSM frame are allocated for forward link transmissions to a wireless terminal such that the wireless terminal must receive and process a number of RF bursts, e.g., 2, 3, 4, or more RF bursts, in each GSM frame. The wireless terminal is able to process the RF bursts contained in these slots and still service reverse link transmissions and the other processing requirements of the wireless terminal.

Figure 2:
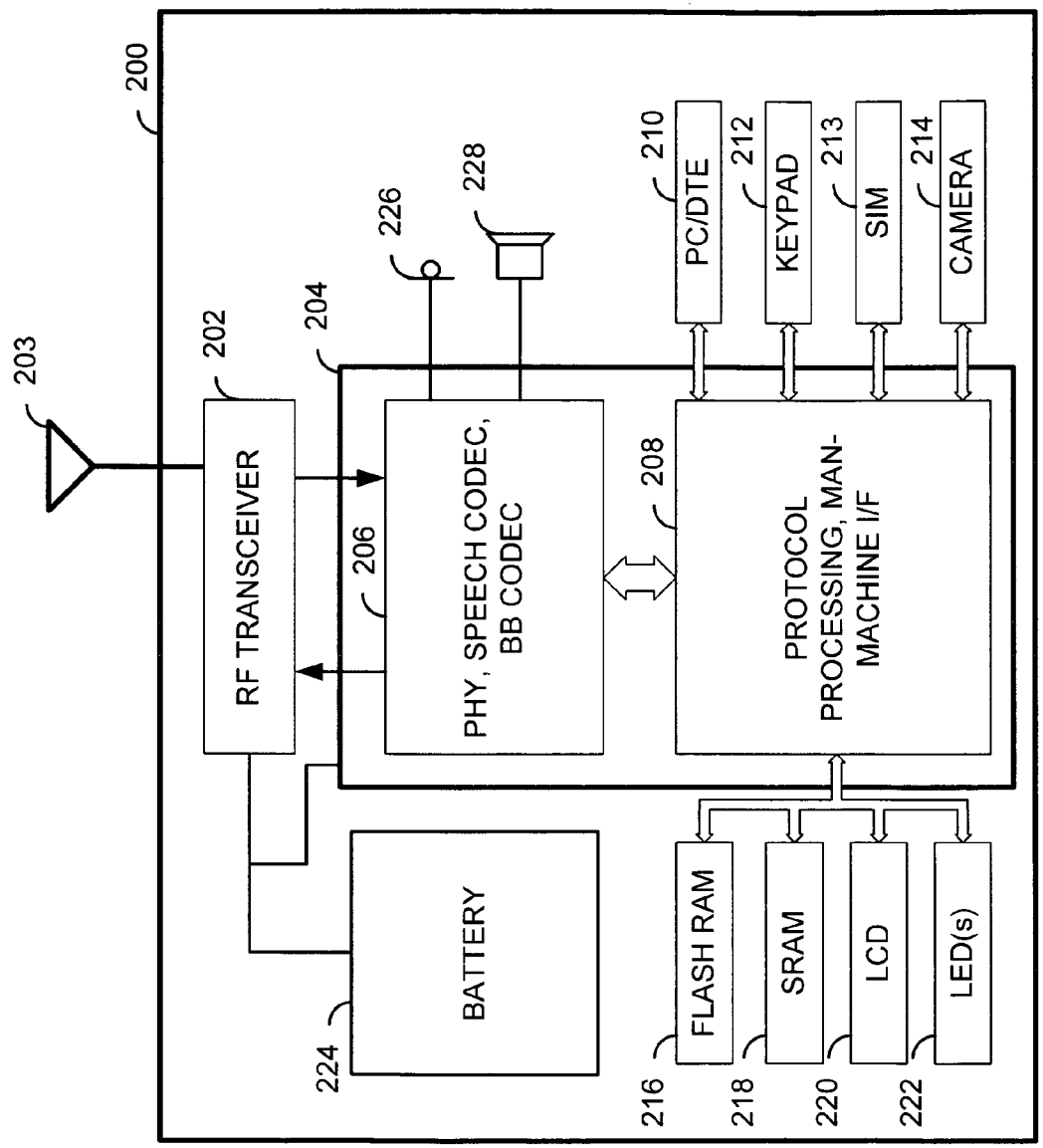
FIG. 2 is a block diagram functionally illustrating a wireless terminal constructed according to the present invention.

FIG. 2 is a block diagram functionally illustrating a wireless terminal 200 constructed according to the present invention. The wireless terminal 200 of FIG. 2 includes an RF transceiver 202, digital processing components 204, and various other components contained within a case. The digital processing components 204 includes two main functional components, a physical layer processing, speech COder/DECoder (CODEC), and baseband CODEC functional block 206 and a protocol processing, man-machine interface functional block 208. A Digital Signal Processor (DSP) is the major component of the physical layer processing, speech COder/DECoder (CODEC), and baseband CODEC functional block 206 while a microprocessor, e.g., Reduced Instruction Set Computing (RISC) processor, is the major component of the protocol processing, man-machine interface functional block 208. The DSP may also be referred to as a Radio Interface Processor (RIP) while the RISC processor may be referred to as a system processor. However, these naming conventions are not to be taken as limiting the functions of these components.

The RF transceiver 202 couples to an antenna 203, to the digital processing components 204, and also to a battery 224 that powers all components of the wireless terminal 200. The physical layer processing, speech COder/DECoder (CODEC), and baseband CODEC functional block 206 couples to the protocol processing, man-machine interface functional block 208 and to a coupled microphone 226 and speaker 228. The protocol processing, man-machine interface functional block 208 couples to a Personal Computing/Data Terminal Equipment interface 210, a keypad 212, a Subscriber Identification Module (SIM) port 213, a camera 214, a flash RAM 216, an SRAM 218, a LCD 220, and LED(s) 222. The camera 214 and LCD 220 may support either/both still pictures and moving pictures. Thus, the wireless terminal 200 of FIG. 2 supports video services as well as audio services via the cellular network.

Figure 3:
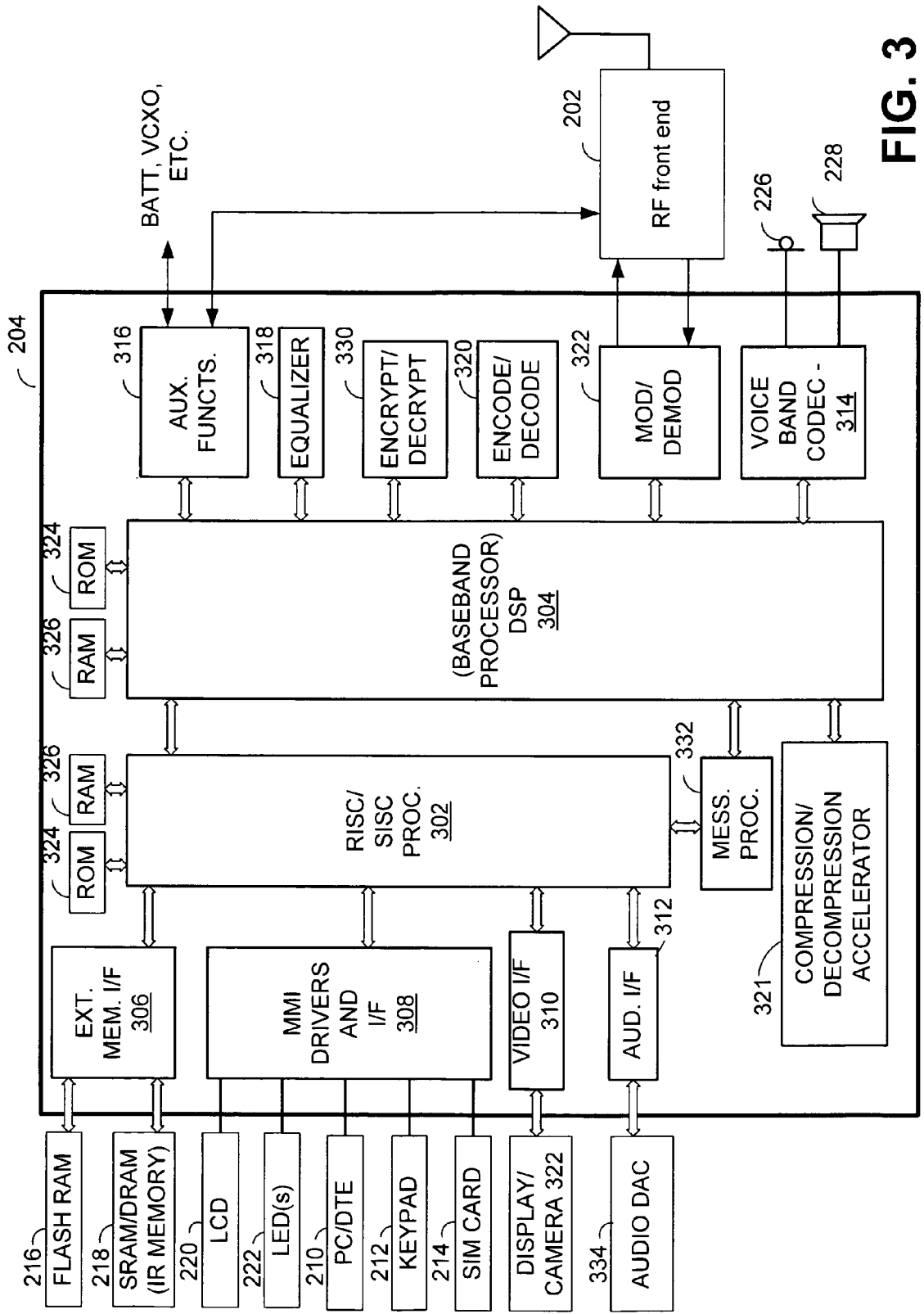
FIG. 3 is a block diagram illustrating in more detail the wireless terminal of FIG. 2, with particular emphasis on the digital processing components of the wireless terminal.

FIG. 3 is a block diagram illustrating in more detail the wireless terminal of FIG. 2, with particular emphasis on the digital processing components of the wireless terminal. The digital processing components 204 include a system processor 302, a baseband processor 304, and a plurality of supporting components. The supporting components include an external memory interface 306, MMI drivers and I/F 308, a video I/F 310, an audio I/F 312, a voice band CODEC 314, auxiliary functions 316, a modulator/demodulator 322, ROM 324, RAM 326 and a plurality of processing modules. In some embodiments, the modulator/demodulator 322 is not a separate structural component with these functions being performed internal to the baseband processor 304.

The processing modules are also referred to herein as accelerators, co-processors, processing modules, or otherwise, and include auxiliary functions 316, an equalizer module 318, an enCOder/DECoder (CODEC) processing module 320, a compression/decompression accelerator 321, and a video process accelerator module 328. The interconnections of FIG. 3 are one example of a manner in which these components may be interconnected. Other embodiments support additional/alternate couplings. Such coupling may be direct, indirect, and/or may be via one or more intermediary components. The compression/decompression processing accelerator 321 and operations of DSP 304 in compressing, decompressing, and error correcting data will be described in more detail with reference to FIGS. 9-14.

RAM and ROM service both the system processor 302 and the baseband processor 304. Both the system processor 302 and the baseband processor 304 may couple to shared RAM 326 and ROM 324, couple to separate RAM, coupled to separate ROM, couple to multiple RAM blocks, some shared, some not shared, or may be served in a differing manner by the memory. In one particular embodiment, the system processor 302 and the baseband processor 304 coupled to respective separate RAMs and ROMs and also couple to a shared RAM that services control and data transfers between the devices. The processing modules 316, 318, 320, 322, and 328 may coupled as illustrated in FIG. 3 but may also coupled in other manners in differing embodiments.

The system processor 302 services at least a portion of a serviced protocol stack, e.g., GSM/GPRS/EDGE protocol stack. The baseband processor 304 in combination with the modulator/demodulator 322, RF transceiver, equalizer module 318, and/or encoder/decoder module 320 service the Physical Layer (PHY) operations performed by the digital processing components 204. The baseband processor 304 may also services a portion of the GSM/GPRS/EDGE protocol stack.

Still referring to FIG. 3, the baseband processor 304 controls the interaction of the baseband processor 304 and equalizer module 318. The baseband processor 304 is responsible for causing the equalizer module 318 and the CODEC processing module 320 to process received RF bursts that reside within slots of a GSM frame. In the particular embodiment of FIGS. 2 and 3, with single RF front end 202, wireless terminal 200 may receive and process RF bursts in up to four slots of each GSM frame, i.e., be assigned four slots for forward link transmissions in any particular GSM frame. In another embodiment in which the wireless terminal 200 includes more than one RF front end, the wireless terminal 200 may be assigned more than four slots in each sub-frame of the GSM frame. In this case, required transmit operations would be performed using a second RF front end while a first RF front end would perform the receive operations. When the forward link transmissions and the reverse link transmissions occupy different channels with sufficient frequency separation, and the wireless terminal otherwise supports full duplex operations, the wireless terminal could receive and transmit at the same time.

The combination of the RF front end 202, and base band processor 204, which may include an optional CODEC processing module, receive RF communications that may contain audio, visual, and data information from the servicing base station. In one embodiment the RF front end 202 and base band processor 204 receive and process RF bursts from servicing base stations. The combination of RF front end 202 and base band processor 204 are operable to receive RF bursts transmitted according to a transmission scheme wherein the transmission scheme includes both a modulation format and a coding format. Base band processor 204 to produce a data block decodes sequences of soft decisions, extracted from the RF bursts. The sequence of soft decisions may decode successfully into the data block as indicated by error correction coding results. This data block may then be decompressed to realize the transmitted communication or data. One such protocol applied to the data block may be the V.42bis standard for data-compressing modems which applies both error correction and data compression to the data.

The V.42bis Compression Standard increases data throughput, and uses a variant of the Lempel-Ziv-Welch (LZW) compression method. Although originally meant to be implemented in modem hardware, this compression can be incorporated into software that interfaces to an ordinary non-compressing modem. The V.42bis Compression Standard can send data compressed or not, depending on the data. For example, some types of data cannot be compressed. A compressed file sent through a V.42bis modem is unlikely to result in a reduction in the file size or transmission time. Indeed the file size or transmission time may actually increase. To avoid this problem, the V.42bis Compression Standard constantly monitors the compressibility of the data. When the V.42bis Compression Standard finds fewer bits may be necessary to send the data uncompressed, the V.42bis Compression Standard switches to a transparent mode. The sender then informs the receiver of this transition and that the data is passed as plain bytes. While transmitting in transparent mode, the sender maintains the LZW trees of strings, and expects the receiver to do likewise. If the sender finds an advantage in returning to compressed mode, the sender will do so, first informing the receiver by a special escape code. Thus the method allows the hardware to adapt to the compressibility of the data.

When operating in a compressed mode, the compression and decompression of the V.42bis Compression Standard may be quite compute intensive. Additionally, the V.42bis Compression Standard performs an error correction function on the data. To address these potentially compute intensive operations, these operations may be dividing between the processor and an accelerator intended to relieve the processor of these operations.

Figure 4:
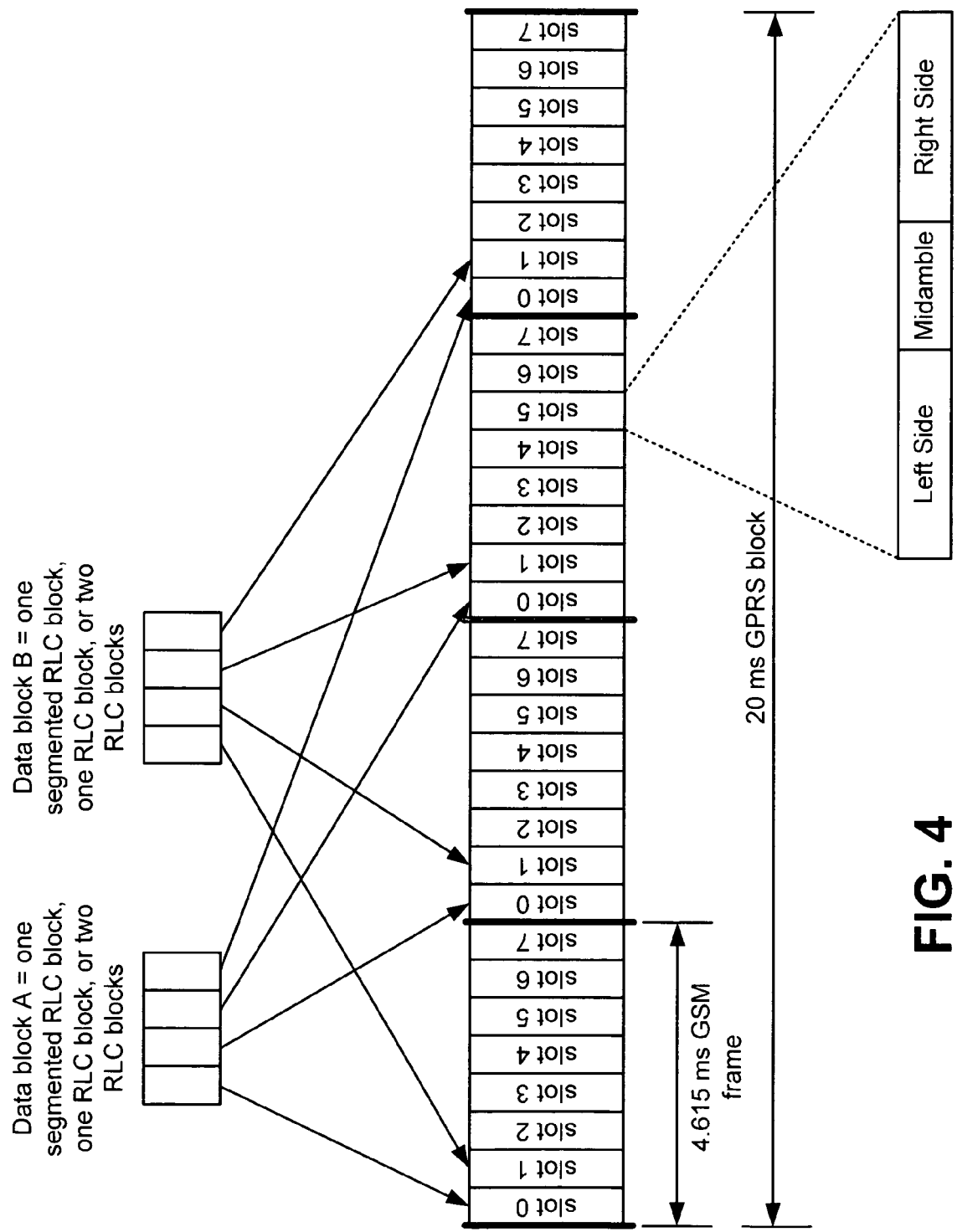
FIG. 4 is a block diagram illustrating the general structure of a GSM frame and the manner in which data blocks are carried by the GSM frame.

FIG. 4 is a block diagram illustrating the general structure of a GSM frame and the manner in which data blocks that may contain audio, video, and data communications, are carried by the GSM frame. The GSM frame is 4.615 ms in duration, including guard periods, and each of which includes eight slots, slots 0 through 7. Each slot is approximately 577 µs in duration, includes a left side, a midamble, and a right side. The left side and right side of a normal RF burst of the time slot carry data while the midamble is a training sequence.

The RF bursts of four time slots of the GPRS block carry a segmented RLC block, a complete RLC block, or two RLC blocks, depending upon a supported Modulation and Coding Scheme (MCS) mode. For example, data block A is carried in slot 0 of sub-frame 1, slot 0 of sub-frame 2, slot 0 of sub-frame 3, and slot 0 of sub-frame 3. Data block A may carry a segmented RLC block, an RLC block, or two RLC blocks. Likewise, data block B is carried in slot 1 of sub-frame 1, slot 1 of sub-frame 2, slot 1 of sub-frame 3, and slot 1 of sub-frame 3. The MCS mode of each set of slots, i.e., slot n of each sub-frame, for the GSM frame is consistent for the GSM frame. Further, the MCS mode of differing sets of slots of the GSM frame, e.g., slot 0 of each sub-frame vs. any of slots 1-7 of each sub-frame, may differ. This ability allows LA to be implemented. As will be described further with reference to FIG. 5, the wireless terminal 200 may be assigned multiple slots for forward link transmissions that must be received and processed by the wireless terminal 200.

Figure 5:
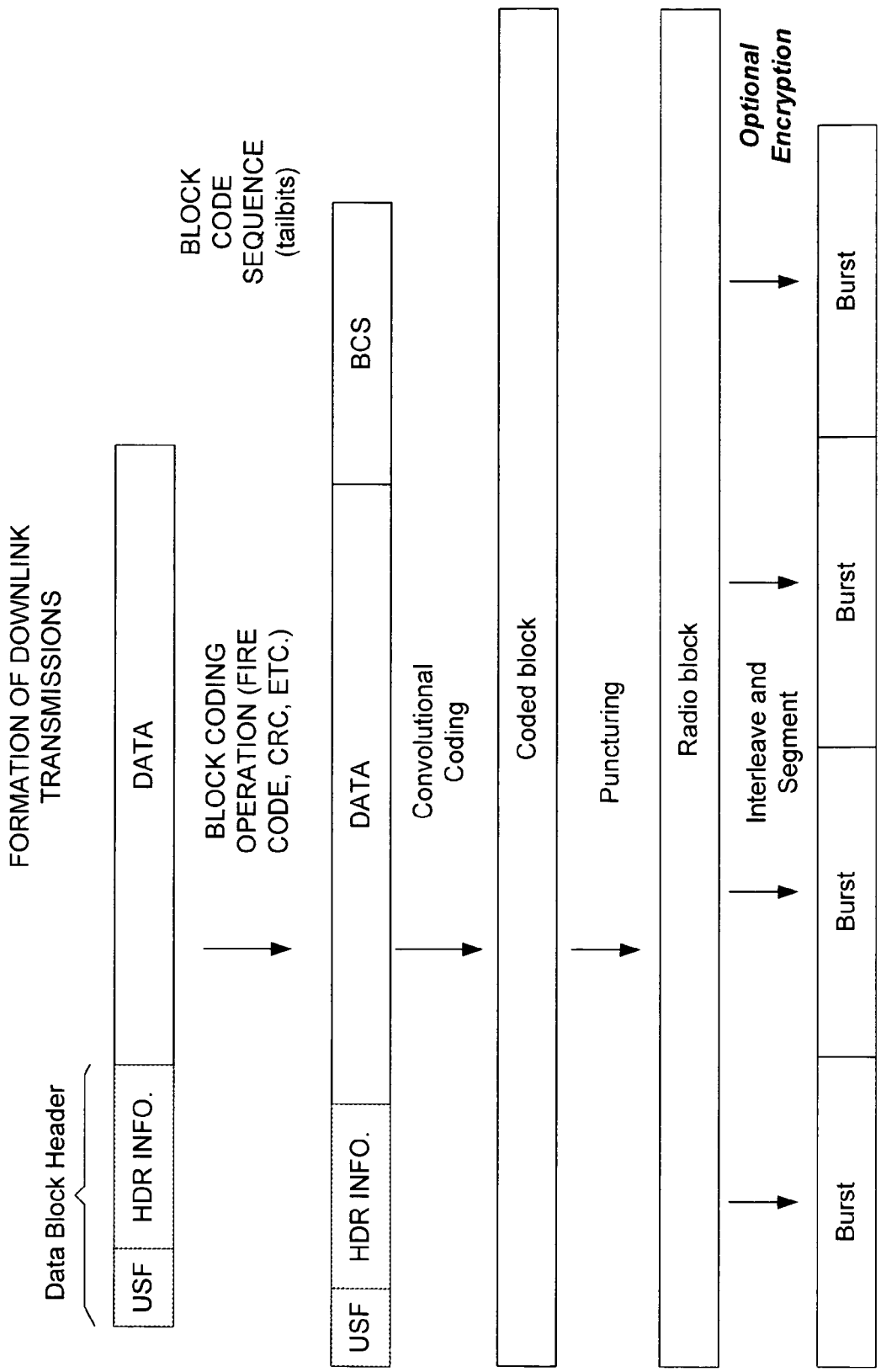
FIG. 5 is a block diagram illustrating the formation of down link transmissions.

FIG. 5 depicts the various stages associated with mapping data into RF bursts. A Data Block Header and Data are initially unencoded. This data may already be compressed to optimize the size of the transmitted RF burst using a data compression protocol such as the V.42bis Compression Standard. The block coding operations perform the outer coding for the data block and support error detection/correction for data block. The outer coding operations typically employ a cyclic redundancy check (CRC) or a Fire Code. The outer coding operations are illustrated to add tail bits and/or a Block Code Sequence (BCS), which is/are appended to the Data. After block coding has supplemented the Data with redundancy bits for error detection, calculation of additional redundancy for error correction to correct the transmissions caused by the radio channels. The internal error correction or coding scheme of GSM is based on convolutional codes.

Some coded bits generated by the convolutional encoder are punctured prior to transmission. Puncturing increases the rate of the convolutional code and reduces the redundancy per data block transmitted. Puncturing additionally lowers the bandwidth requirements such that the convolutional encoded signal fits into the available channel bit stream. The convolutional encoded punctured bits are passed to an interleaver, which shuffles various bit streams and segments the interleaved bit streams into the 4 bursts shown.

Each RF burst has a left side, a midamble, and a right side. The left side and right side contain data. The midamble consists of predefined, known bit patterns, the training sequences, which are used for channel estimation to optimize reception with an equalizer and for synchronization. With the help of these training sequences, the equalizer eliminates or reduces the inter-symbol interferences, which can be caused by propagation time differences of multipath propagation. A number of training sequences are defined for normal RF bursts in the GSM standard. However, the exact configuration of the training sequences may depend on the modulation format used. Each set of four bursts typically utilizes the same modulation format. By analyzing the training sequence one can determine the modulation format.

Figure 6:
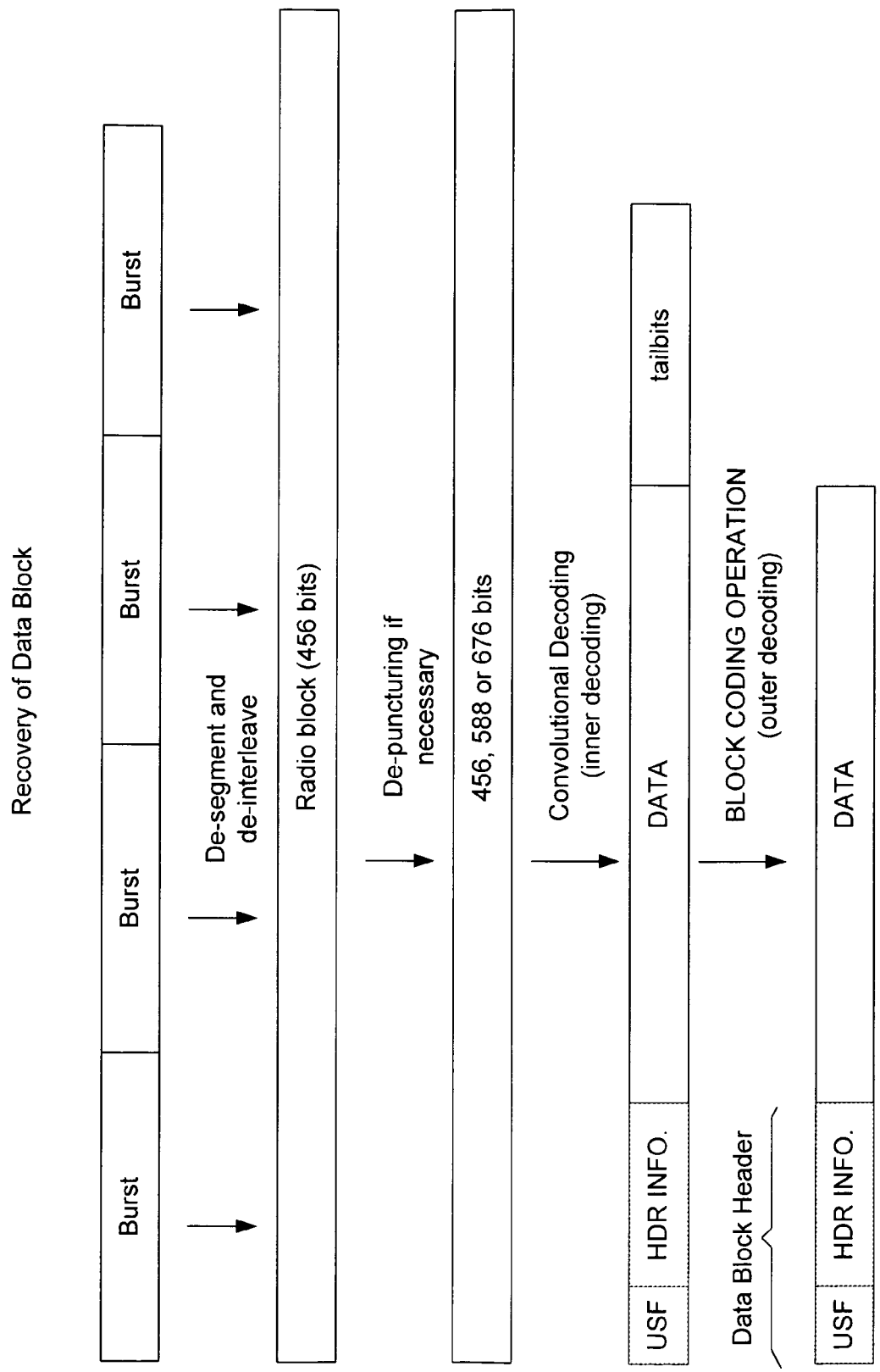
FIG. 6 is a block diagram illustrating the recovery of a data block from a down link transmissions.

FIG. 6 is a block diagram depicting the various stages associated with recovering a data block from RF bursts. Four RF bursts making up a data block are received and processed. Once all four RF bursts have been received, the RF bursts are combined to form an encoded data block. The encoded data block is then depunctured (if required), decoded according to an inner decoding scheme, and then decoded according to an outer decoding scheme. For MCS 1-4, the decoded data block includes the data block header and the data, for MCS5-9, data block and header block are coded separately. Successful decoding may be signaled by appropriate tail bits appended to the data following convolutional decoding (error correction coding). The communication may then be uncompressed from the data block and error checked in accordance with a data compression protocol such as the V.42bis Compression Standard.

Figure 7:
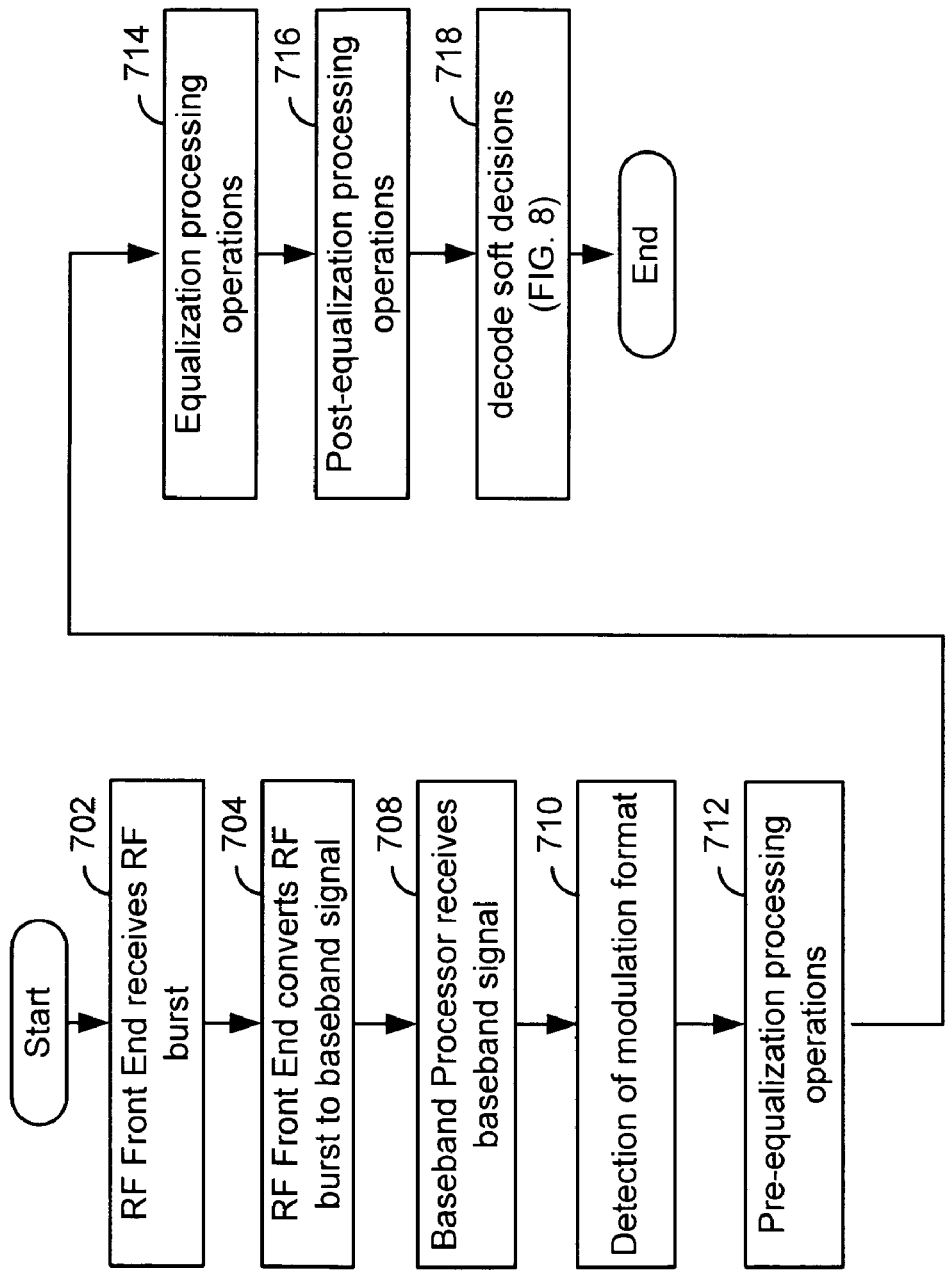
FIG. 7 is a flow chart illustrating operation of a wireless terminal in receiving and processing a RF burst.
Figure 8:
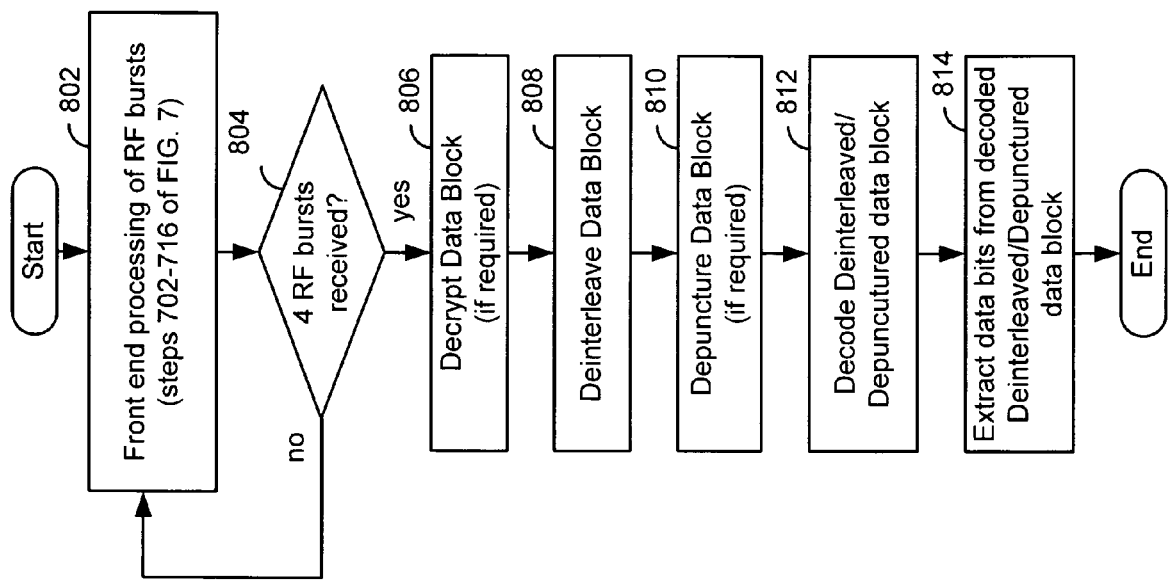
FIG. 8 is a flow chart illustrating operations to recover a data block.

FIGS. 7 and 8 are flow charts illustrating operation of a wireless terminal 200 in receiving and processing RF bursts to recover a data block. The operations illustrated correspond to a single RF burst in a corresponding slot of GSM frame. The RF front end 202, the baseband processor 304, and the equalizer module 318 illustrated in FIG. 3 perform these operations. These operations are generally called out as being performed by one of these components. However, the split of processing duties among these various components may differ without departing from the scope of the present invention.

A single processing device or a plurality of processing devices operably coupled to memory performs the processing duties. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing duties are implemented via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. The processing duties include the execution of operational instructions corresponding to at least some of the steps and/or functions may be described later.

Referring particularly to FIG. 7, operation commences with the RF front end 202 receiving an RF burst in a corresponding slot of a GSM frame (step 702). The RF front end 202 then converts the RF burst to a baseband signal (step 704). Upon completion of the conversion, the RF front end 202 stores the converted baseband signal. When needed the baseband processor samples the converted baseband signal from the RF front end. Thus, as referred to in FIG. 7, the RF front end 202 performs steps 702-704.

Operation continues with the baseband processor 304 receiving the baseband signal (step 708). In a typical operation, the RF front end 202, the baseband processor 304, or modulator/demodulator 322 samples the analog baseband signal to digitize the baseband signal. After receipt of the baseband signal (in a digitized format), the baseband processor 304 performs detection of a modulation format of the baseband signal (step 710). This detection of the modulation format determines the modulation format of the corresponding baseband signal. Proper determination of the modulation format is necessary in order to properly estimate the channel quality from the SNR of the channel. According to the GSM standard, the modulation format will be either Gaussian Minimum Shift Keying (GMSK) modulation or Eight Phase Shift Keying (8PSK) modulation. The baseband processor 304 makes the determination (step 712) and appropriately processes the RF bursts based upon the detected modulation format.

The baseband processor performs pre-equalization processing of the RF burst in step 712. The pre-equalization processing operations produce a processed baseband signal. Upon completion of these pre-equalization processing operations, the baseband processor 304 issues a command to the equalizer module 318.

The equalizer module 318, upon receiving the command, prepares to equalize the processed baseband signal based upon the modulation format, e.g., GMSK modulation or 8PSK modulation in step 714. The equalizer module 318 receives the processed baseband signal, settings, and/or parameters from the baseband processor 304 and equalizes the processed baseband signal.

After equalization, the equalizer module 318 then issues an interrupt to the baseband processor 304 indicating that the equalizer operations are complete for the RF bursts. The baseband processor 304 then receives the soft decisions from the equalizer module 318. Next, the baseband processor 304 performs "post-equalization processing" as shown in step 716. This may involve determining an average phase of the left and right sides based upon the soft decisions received from the equalizer module 318 and frequency estimation and tracking based upon the soft decisions received from the equalizer module 318.

The sequences of soft decisions are decoded in step 718 to produce the data bits containing the audio, video and data communications. One particular method of decoding the soft decisions is further detailed in FIG. 8. While the operations of FIG. 7 are indicated to be performed by particular components of the wireless terminal, such segmentation of operations could be performed by differing components. For example, the baseband processor 304 or system processor 302 in other embodiments could perform the equalization operations. Further, the baseband processor 304 or the system processor 302 in other embodiments could also perform decoding operations.

FIG. 8 is a flow chart illustrating operations to decode a data block. Operations commence with receiving and processing RF bursts (front-end processing of RF bursts) in step 802 and as described with reference to steps 702-716 of FIG. 7. After receiving the four RF bursts that complete an EDGE or GPRS data block, as determined at step 804, operation proceeds to step 806.

Data recovery begins in step 806 where, if necessary, the data block is decrypted. The data block is then de-interleaved (step 808) according to a particular format of the data block, e.g. MCS-1 through MCS-9. The data block is then de-punctured (step 810). At step 812, the de-interleaved and de-punctured data block is decoded. Decoding operations may include combining previously received copies of the data block with the current copy of the data block. Data bits of the decoded data block are then processed further (step 814). These data bits may take the form of compressed data to be further processed. FIGS. 9-14 address the decompression and error correction of real time communications contained within forward link communications and compression of real time communications for reverse link communications.

Figure 9:
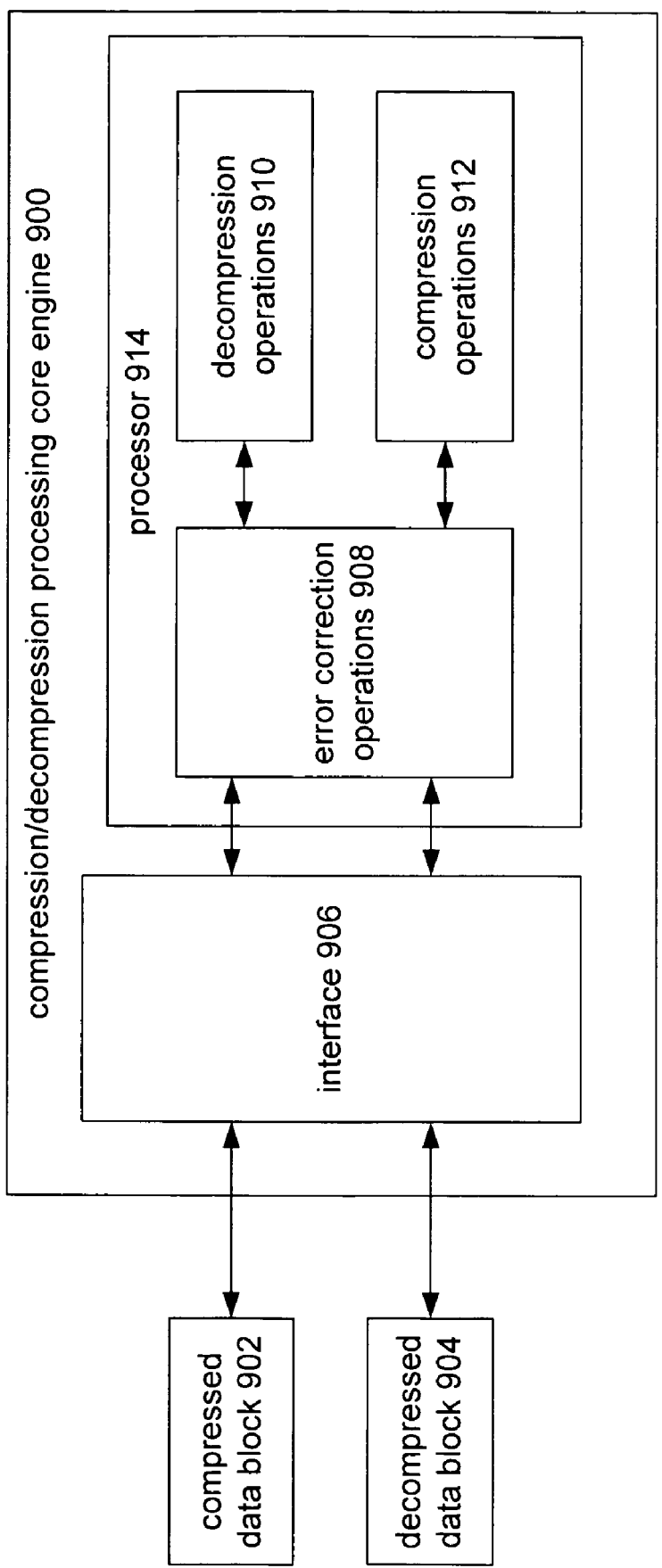
FIG. 9 provides a functional block diagram of a compression/decompression processing core engine.

FIG. 9 is a block diagram illustrating the performance of compression, decompression, and error correction by a processing core engine 900 within a wireless terminal. The processing core engine 900 may service the V.42bis Compression Standard or any other like compression standard known to those skilled in the art. The V.42bis Compression Standard is based upon the Lempel-Ziv-Welch (LZW) lossless data compression algorithm. The LZW compression algorithm automatically builds a dictionary of previously seen strings in the data being compressed. The dictionary does not have to be transmitted with the compressed data, since the decompressor can reconstruct the dictionary the same way the compressor does, and if coded correctly, will have exactly the same strings that the compressor dictionary had at the same point in the data.

In FIG. 9 data is either received as a compressed data block 902 or an uncompressed data block 904 depending on the mode of operation of the compression decompression processing core engine 900. These modes may be a compression mode, decompression mode or transparent mode. In the transparent mode, compression actually increases the size of the data. In either case the data block to be compressed or decompressed is received via interface 906. Error correction operations 908 may be performed when using a compression standard which has error correction such as the V.42bis compression standard. Not all compression standards will have error correction operations 908. However all compression standards will then carry out compression operations 910 and decompression operations 912. Optional error correction functions 908, decompression functions 910 and compression functions 912 may be performed by a processor 914. Processor 914 includes both dedicated hardware, such as DSP 304 and compression/decompression accelerator 321, as shown in FIG. 3. The manner in which these duties are split will be described further.

Figure 10:
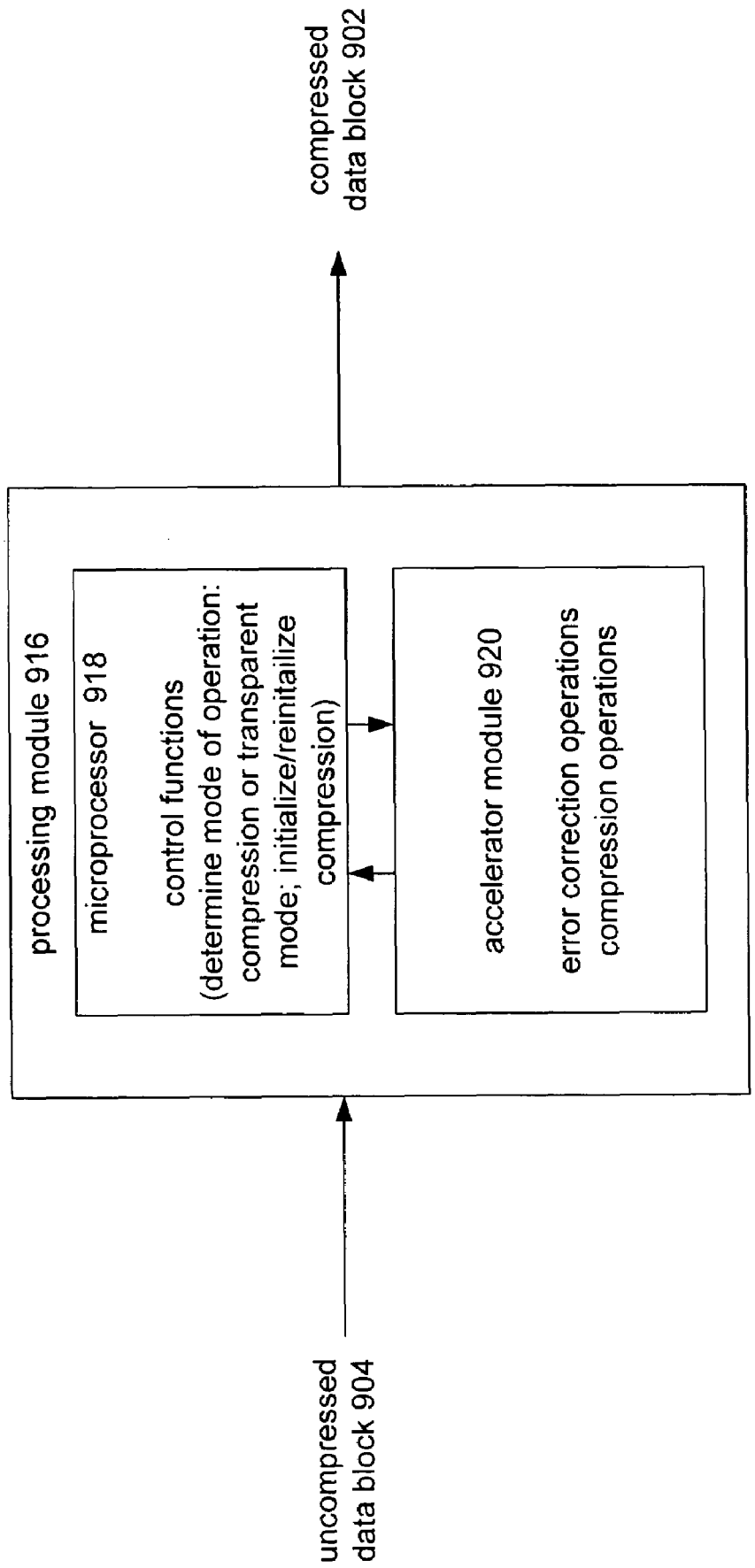
FIG. 10 provides a block diagram depicting the division of labor within the video processing module to compress the data.

FIG. 10 is a block diagram illustrating compression processing operations of the compression/decompression processing core engine 900 with particular emphasis on a division of processing duties within processing module 916. Here, the compression of the uncompressed data block 904 is split between microprocessor 918 and compression/decompression accelerator module 920 to produce compressed data block 902. Microprocessor 918 executes instructions that coordinate the processing duties shared between microprocessor 918 and compression/decompression accelerator module 920 which exchange data through internal shared memory or registers. Compute intensive operations such as error correction operations and compression operations may be performed by the accelerator module. For example, microprocessor 918 may send discrete pieces of data to the accelerator for processing through shared memory. This shared memory, and the location of raw data, may be identified by a pointer passed from microprocessor to the accelerator module. In one embodiment the accelerator receives a 64 bit instruction word from the microprocessor. The instructions tell the accelerator where to retrieve the data to be processed, what processes are to be performed, and where the results are to be placed. The accelerator module may claim all required memory necessary to perform the specified calculations. When the accelerator module has completed this processing the results are placed within a specified location in shared memory and retrieved by the microprocessor. In some cases, this may allow the processing to occur 8 to 10 times faster. These compression operations may include dictionary functions, such as string matching. The accelerator module may utilize dedicated arithmetic logic units (ALUs) to perform these tasks. Microprocessor 918 performs control functions such as determining the mode of operation (i.e. is the transparent mode warranted?) and may correspond to 302 of FIG. 3. These control functions may include but are not limited to the determination of initialization of the data compression function and a mechanism for switching between compressed and transparent modes of operation.

This architecture exploits parallel processing made available by the use of both the microprocessor and accelerator module. Furthermore, the use of 64 bit instructions and registers allow the final code executed by the processing module to be as compact as possible. The accelerator, when configured by the 64 bit instruction creates a state machine capable of performing specific operations much faster than a more generic microprocessor. This may allow the use of larger dictionaries to more quickly perform compression and decompression operations and reduce memory latency. Also, this may allow the complexity of the microprocessor itself to be simplified.

The architecture may employ a plain 64-bit microcoded engine with a set of registers, pointers and external memory access. This allows for a hardware implementation of table compression that utilizes accelerating codeword-based compression algorithms in the cellular infrastructure. Multiple branch targets with specific pack and unpack as described in the following tables may be implemented within the hardware. In one embodiment, each instruction word can hold two explicit conditional branch targets and a 'fall-through' implicit target yielding three total instruction targets that can be selected for the next cycle for each instruction. This allows a highly compact instructions sequences (saving space AND time) for code that has a rich condition and branching structure, such as v.42bis. Simplification of the branching conditions is performed by having an implicit ordering BR 1, BR2, and Fall-through. Each branch instruction field selects an AND of a set of condition codes, each code is optionally inverted. When the signal pattern matches, the branch associated with the match is taken. If the match fails, the next ordered branch condition is tested. The default is to proceed to the next instruction without taking the branch.

This accelerator for v42bis enhancement uses packed codewords to save space and hardware support to pack and unpack these codewords efficiently. To unpack codewords, the register address space from the MOV instruction fields is used to move subfields of the codeword register (entry1 and entry2) to other registers and codeword subfields. To pack codewords, a write mode for the two codeword registers is used to select a set of source registers for each subfield of the codeword. This allows a single cycle write of all packed fields as soon as the values are available. These two features allow complex state machines to be microcoded in a compact and efficient manner that is extendable via reprogramming the instruction memory associated with the accelerator. This enables easy post-fabrication repair of any bugs or changes in the standard that may occur. Similar algorithms with the same condition structure and concurrent operation set may be implemented on the accelerator or minor changes to the instruction word and architectural features may be implemented. This makes the state machine implementations of algorithms like v42bis simpler, less prone to error and makes cheap field updates possible.

Tables 1 through XX provide exemplary tables for the accelerator. The Instruction word map is provided in Table 1. This is a table of the instruction fields in microcode instruction word. The 'name' of the field is followed by three numbers: the 32-bit word (of 2 32-bit words=64 bits total), in which the field resides, the offset within the 64-bit field and the size, in bits, of the field. The word & bit offset information is redundant so any patent tables should just have bit-offset and size fields.

TABLE 1

INSTRUCTION WORD MAP

```
char *name; // Name of the field
    unsigned word; // Which of the two 32-bit words it's in 0=low,
    1=high
    unsigned offset; // bit offset into 64 bit field (to easily match to
verilog)
    unsigned size;  // # of bits in field (for masking)
    // BR (x2) : NOP=6h3F
    { "br1_index", 1, 58, 6 },     // Branch PC Value
    { "br1_cond_negate", 1, 57, 1 },   // cond s1 negation, br1
    { "br1_cond_c1", 1, 53, 4 }, // cond subfield 1, br1
    { "br1_cond_c2", 1, 51, 2 }, // cond subfield 2, br1
    { "br1_cond", 1, 51, 7 },    // Refer to conditon field definition
    { "br2_index", 1, 45, 6 },     // Branch PC Value
    { "br2_cond_negate", 1, 44, 1 }, // cond s1 negation, br2
    { "br2_cond_c1", 1, 40, 4 }, // cond subfield 1, br2
    { "br2_cond_c2", 1, 38, 2 }, // cond subfield 2, br2
    { "br2_cond", 1, 38, 7 },    // Refer to conditon field definition
    // MOV (x2) : NOP=1'b0,dst
    { "mov1_dst", 1, 34, 4 },
    { "mov1_src", 2, 29, 5 },
    { "mov2_dst", 0, 25, 4 },
    { "mov2_src", 0, 20, 5 },
    // SET
    { "set_fieldno", 0, 19, 1 },
    { "set_brother", 0, 15, 4 },
    { "set_child", 0, 11, 4 },
    { "set_youngest", 0, 9, 2 },
    { "set_leaf", 0, 7, 2 },
    // LD/ST/CMP
    { "cmp_reg2", 0, 7, 4 },
```

TABLE 1-continued

INSTRUCTION WORD MAP

```
    { "lsc_op", 0, 5, 2 },
    { "lsc_entry", 0, 4, 1 },
    { "lsc_reg", 0, 0, 4 },
    { "cmp_reg1", 0, 0, 4 },
    // Condition Field Definition (2 subfields)
    { "cond_negate_s1", 0, 6, 1 },
    { "cond_subfield_1", 0, 2, 4 },
    { "cond_subfield_2", 0, 0, 2 }
```

The Register Map is provided in Table 2. Fields such as entry1.char and entry1.brother explicitly treat as individual registers selected subfields of the table codeword. This allows us to implicitly unpack codewords loaded from the table without performing extra arithmetic operations. The map in Table 2 relates the assembly instruction name to the Verilog register name and an instruction id that is used in the MOV instruction field.

TABLE 2

REGISTER MAP

```
struct {
    char *name;
    char *vname;
    unsigned value;
} mov_addr_map[31] = {
    { "iself", "MAiSelf", 0x00 },
    { "inext", "MAiNext", 0x01 },
    { "ilast", "MAiLast", 0x02 },
    { "iparent", "MAiParent", 0x03 },
    { "iprev", "MAiPrevious", 0x04 },
    { "itemp", "MAiTemp", 0x05 },
    { "nextcodeword", "MAnextCodeword", 0x06 },
    { "increg", "MAincreg", 0x07 },
    { "entry1.char", "MAeSelf_char", 0x08 },
    { "entry2.char", "MAeOld_char", 0x09 },
    { "nextchar", "MAnextChar", 0x0A },
    { "length", "MAlength", 0x0B },
    { "charreg", "MAcharReg", 0x0C },
    { "entry1", "MAeSelf", 0x0D },
    { "entry2", "MAeOld", 0x0E },
    { "status", "MAstatus", 0x0F },
    { "entry1.brother", "MAeSelf_brother", 0x10 },
    { "entry1.child", "MAeSelf_child", 0x11 },
    { "entry2.brother", "MAeOld_brother", 0x12 },
    { "entry2.child", "MAeOld_child", 0x13 },
    { "chartoindex", "MAcharToIndex", 0x14 },
    { "maxlength", "MAmaxlength", 0x15 },
    { "0", "MAzero", 0x16 },
    { "1", "MAone", 0x17 },
    { "3", "MAthree", 0x18 },
    { "5", "MAfive", 0x19 },
    { "9", "MAnine", 0x1A },
    { "17", "MAseventeen", 0x1B },
    { "33", "MAthirtythree", 0x1C },
    { "65", "MAsixtyfive", 0x1D },
    { "localcycles", "MAlocalCycles", 0x1F }
};
```

Table 3 and Table 4 provide the function prototypes and coding definitions respectively.

TABLE 3

FUNCTION PROTOTYPES

```
// Reading, parsing & writing
void init( void );
void read_file( FILE *input );
void strip_line( char *line, char *inst );
void link ( void );
```

TABLE 3-continued

FUNCTION PROTOTYPES

```
    void write_to_file( FILE *output );
    // Mapping tokens to encoded microcode
    void map_MOV( char *dst, char *src, int firstP );
    void map_LD( char *dst, char *src );
    void map_ST( char *dst, char *src );
    void map_CMP( char *r1, char *r2 );
    void map_SET( int eReg, char *field, char *src );
    void map_BR( char *inst, char *c1, int neg1, char *c2, int firstP );
    void write_field_int( char *fname, unsigned value, unsigned
    inst_index );
    // Utility functions
    void tobinary(char *dst, unsigned src, unsigned width);
    void dump_debug_info( char *line, char *inst, char *ident1,
    char *ident2, char *ident3 );
    void print_error( char *msg );
    char *cvtupper( char *ascii );
    char *cvtlower( char *ascii );
```

TABLE 4

CODING DEFINITION

```
// Instruction code target
typedef struct {
  char name[30];
  char btarg[2][30];
  long inst[2];
} INSTRUCTION;
INSTRUCTION ucodeArray[64];
int field_map_size = 27;
struct {
  char *name; // Name of the field
  unsigned word; // Which of the two 32-bit words it's in 0=low,
  1=high
  unsigned offset; // bit offset into 64 bit field (to easily match to
  verilog)
  unsigned size; // # of bits in field (for masking)
} field_map[27] = {
  // BR (x2) : NOP=6h3F
  { "br1_index", 1, 58, 6 },    // Branch PC Value
  { "br1_cond_negate", 1, 57, 1 }, // cond s1 negation, br1
  { "br1_cond_c1", 1, 53, 4 },  // cond subfield 1, br1
  { "br1_cond_c2", 1, 51, 2 },  // cond subfield 2, br1
  { "br1_cond", 1, 51, 7 },     // Refer to conditon field definition
  { "br2_index", 1, 45, 6 },    // Branch PC Value
  { "br2_cond_negate", 1, 44, 1 }, // cond s1 negation, br2
  { "br2_cond_c1", 1, 40, 4 },  // cond subfield 1, br2
  { "br2_cond_c2", 1, 38, 2 },  // cond subfield 2, br2
  { "br2_cond", 1, 38, 7 },     // Refer to conditon field definition
  // MOV (x2) : NOP=1'b0,dst
  { "mov1_dst", 1, 34, 4 },
  { "mov1_src", 2, 29, 5 },
  { "mov2_dst", 0, 25, 4 },
  { "mov2_src", 0, 20, 5 },
  // SET
  { "set_fieldno", 0, 19, 1 },
  { "set_brother", 0, 15, 4 },
  { "set_child", 0, 11, 4 },
  { "set_youngest", 0, 9, 2 },
  { "set_leaf", 0, 7, 2 },
  // LD/ST/CMP
  { "cmp_reg2", 0, 7, 4 },
  { "lsc_op", 0, 5, 2 },
  { "lsc_entry", 0, 4, 1 },
  { "lsc_reg", 0, 0, 4 },
  { "cmp_reg1", 0, 0, 4 },
  // Condition Field Definition (2 subfields)
  { "cond_negate_s1", 0, 6, 1 },
  { "cond_subfield_1", 0, 2, 4 },
  { "cond_subfield_2", 0, 0, 2 }
};
int mov_addr_map_size = 31;
int mov_addr_map_data = 5;
struct {
```

TABLE 4-continued

CODING DEFINITION

```
  char *name;
  char *vname;
  unsigned value;
} mov_addr_map[31] = {
  { "iself", "MAiSelf", 0x00 },
  { "inext", "MAiNext", 0x01 },
  { "ilast", "MAiLast", 0x02 },
  { "iparent", "MAiParent", 0x03 },
  { "iprev", "MAiPrevious", 0x04 },
  { "itemp", "MAiTemp", 0x05 },
  { "nextcodeword", "MAnextCodeword", 0x06 },
  { "increg", "MAincreg", 0x07 },
  { "entry1.char", "MAeSelf_char", 0x08 },
  { "entry2.char", "MAeOld_char", 0x09 },
  { "nextchar", "MAnextChar", 0x0A },
  { "length", "MAlength", 0x0B },
  { "charreg", "MAcharReg", 0x0C },
  { "entry1", "MAeSelf", 0x0D },
  { "entry2", "MAeOld", 0x0E },
  { "status", "MAstatus", 0x0F },
  { "entry1.brother", "MAeSelf_brother", 0x10 },
  { "entry1.child", "MAeSelf_child", 0x11 },
  { "entry2.brother", "MAeOld_brother", 0x12 },
  { "entry2.child", "MAeOld_child", 0x13 },
  { "chartoindex", "MAcharToIndex", 0x14 },
  { "maxlength", "MAmaxlength", 0x15 },
  { "0", "MAzero", 0x16 },
  { "1", "MAone", 0x17 },
  { "3", "MAthree", 0x18 },
  { "5", "MAfive", 0x19 },
  { "9", "MAnine", 0x1A },
  { "17", "MAseventeen", 0x1B },
  { "33", "MAthirtythree", 0x1C },
  { "65", "MAsixtyfive", 0x1D },
  { "localcycles", "MAlocalCycles", 0x1F }
};
#define LSC_OP_ST 3
#define LSC_OP_LD 2
#define LSC_OP_CMP 1
#define LSC_OP_NOP 0
// LD/ST source/target definition
int ldst_addr_map_size = 13;
int ldst_addr_map_data = 4;
struct {
  char *name;
  char *vname;
  unsigned value;
} ldst_addr_map[13] = {
  { "iself", "iSelf", 0x0 },
  { "inext", "iNext", 0x1 },
  { "ilast", "iLast", 0x2 },
  { "iparent", "iParent", 0x3 },
  { "iprev", "iPrevious", 0x4 },
  { "itemp", "iTemp", 0x5 },
  { "nextcodeword", "nextCodeword", 0x6 },
  { "entry1.brother", "eSelf_brother", 0x8 },
  { "entry1.child", "eSelf_child", 0x9 },
  { "entry2.brother", "eOld_brother", 0xA },
  { "entry2.child", "eOld_child", 0xB },
  { "chartoindex", "charToIndex", 0xC },
  { "increg", "charToIndex", 0xD }
};
// CMP field definition
int cmp_addr_map_size = 14;
int cmp_addr_map_data = 4;
struct {
  char *name;
  char *vname;
  unsigned value;
} cmp_addr_map[14] = {
  { "iself", "iSelf", 0x0 },
  { "inext", "iNext", 0x1 },
  { "ilast", "iLast", 0x2 },
  { "iparent", "iParent", 0x3 },
  { "iprev", "iPrevious", 0x4 },
  { "itemp", "iTemp", 0x5 },
  { "entry1.brother", "eSelf_brother", 0x6 },
```

TABLE 4-continued

CODING DEFINITION

```
    { "entry1.child", "eSelf_child", 0x7 },
    { "entry2.brother", "eOld_brother", 0x8 },
    { "entry2.child", "eOld_child", 0x9 },
    { "length", "length", 0xA },
    { "maxlength", "maxlength", 0xB },
    { "0", "zero", 0xC },
    { "1", "one", 0xD }
};
// Subfield 1 definitions
int cond1_map_size = 16;
int cond1_map_data = 4;
struct {
    char *name;
    char *vname;
    unsigned value;
} cond1_map[16] = {
    { "none", "none", 0x0 },
    { "chars_empty", "chars_empty", 0x1 },
    { "entry1.youngest", "eSelf_youngest", 0x2 },
    { "localcycles_exc", "localCycles_exc", 0x3 },
    { "decode_mode", "decode_mode", 0x4 },
    { "root_codeword", "root_codeword", 0x5 },
    { "codes_empty", "codes_empty", 0x6 },
    { "length_exceeded", "length_exceeded", 0x7 },
    { "entry1.leaf", "eSelf_leaf", 0x8 },
    { "entry2.leaf", "eOld_leaf", 0x9 },
    { "entry2.youngest", "eOld_youngest", 0xA },
    { "ch_lt", "ch_lt", 0xB },
    { "ch_eq", "ch_eq", 0xC },
    { "ch_gt", "ch_gt", 0xD },
    { "undef_codeword", "undef_codeword", 0xE },
    { "cmp_eq", "cmp_eq ", 0xF }
};
// Subfield 2 definitions
int cond2_map_size = 4;
int cond2_map_data = 2;
struct {
    char *name;
    char *vname;
    unsigned value;
} cond2_map[4] = {
    { "none", "cond2_none", 0x0 },
    { "chars_empty", "cond2_chars_empty", 0x1 },
    { "entry1.youngest", "cond2_eSelf_youngest", 0x2 },
    { "~entry1.youngest", "cond2_eSelf_notyoungest", 0x3 }
};
#define SET_BIT_NOP 0x0
#define SET_BIT_SET 0x2
#define SET_BIT_CLEAR 0x3
// SET brother/child definition
int setbc_map_size = 14;
int setbc_map_data = 4
struct {
    char *name;
    char *vname;
    unsigned value;
} setbc_map[14] = {
    { "0", "set2zero", 0x0 },
    { "iself", "set2iSelf", 0x1 },
    { "inext", "set2iNext", 0x2 },
    { "ilast", "set2iLast", 0x3 },
    { "iparent", "set2iParent", 0x4 },
    { "iprev", "set2iPrevious", 0x5 },
    { "itemp", "set2iTemp", 0x6 },
    { "nextcodeword", "set2nextCodeword", 0x7 },
    { "entry1.brother", "set2eSelf_brother", 0x9 },
    { "entry1.child", "set2eSelf_child", 0xA },
    { "entry2.brother", "set2eOld_brother", 0xB },
    { "entry2.child", "set2eOld_child", 0xC },
    { "chartoindex", "set2charToIndex", 0xD },
    { "nop", "set2nop", 0xF }
};
```

Figure 11:
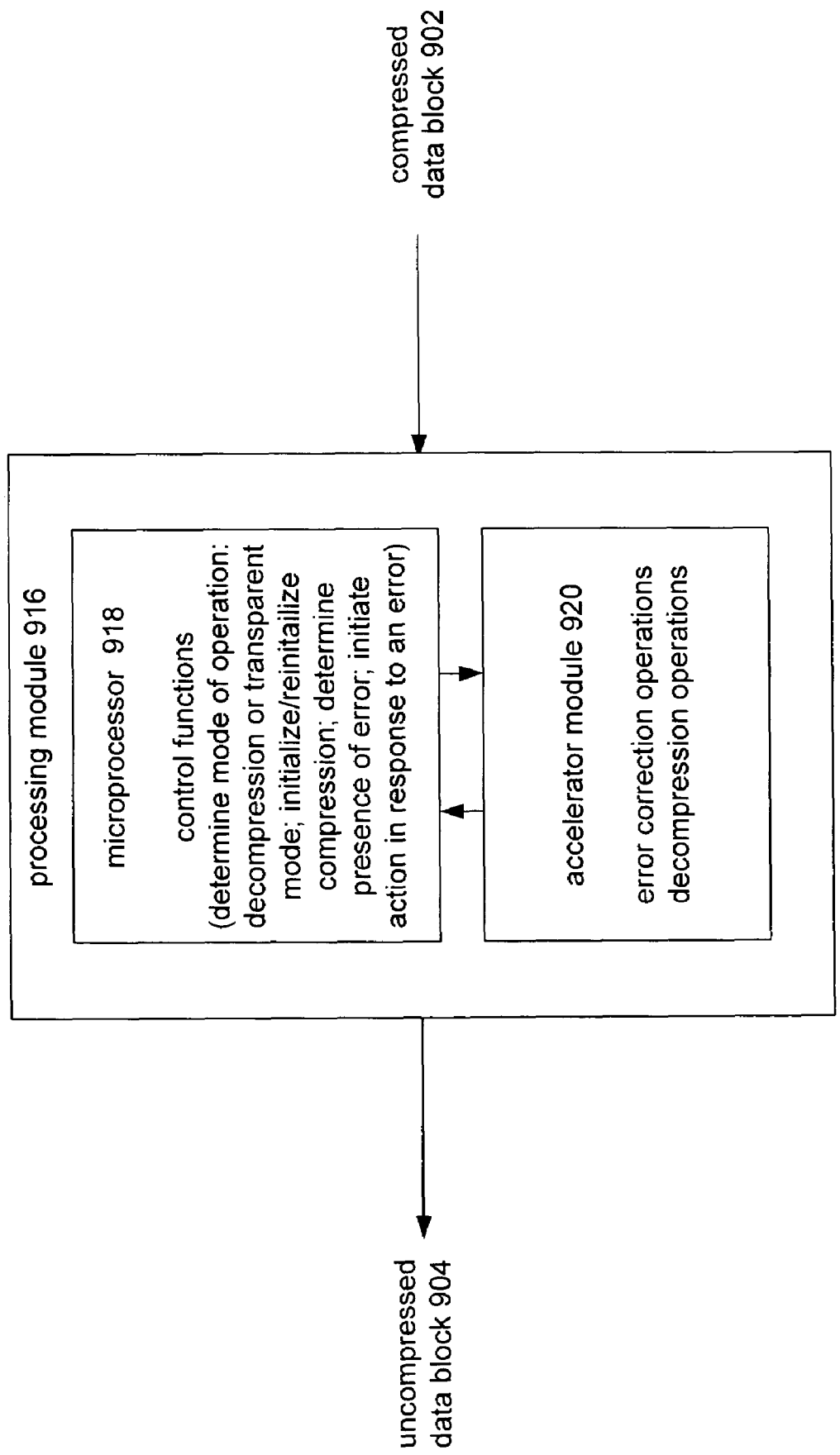
FIG. 11 provides a block diagram depicting the division of labor to decompress data within a processing module.

FIG. 11 is a block diagram illustrating decompression processing operations of the compression/decompression processing core engine 900 with particular emphasis on a division of processing duties within processor 916. Here, the compression of the compressed data block 902 is split between microprocessor 918 and compression/decompression accelerator module 920 to produce uncompressed data block 904. Compute intensive operations such as error correction operations and decompression operations may be performed by the accelerator module. As previously stated, the accelerator module may utilize dedicated ALUs to perform these tasks. Microprocessor 918 performs control functions such as determining the mode of operation from data block 902, wherein data block 902 may contain command codes to indicate when the transparent mode is in use. These control functions may include but are not limited to: (1) the determination of the presence of the data compression function and of parameters associated with the operation of the data compression function; initialization or re-initialization of the data compression function; coordination of the establishment of an error controlled connection for use by the peer data compression functions; coordination of the delivery of data between the interface and the data compression function; coordination of the delivery of data between the data compression function and the error control function; and taking action upon detecting an error condition.

Figure 12:
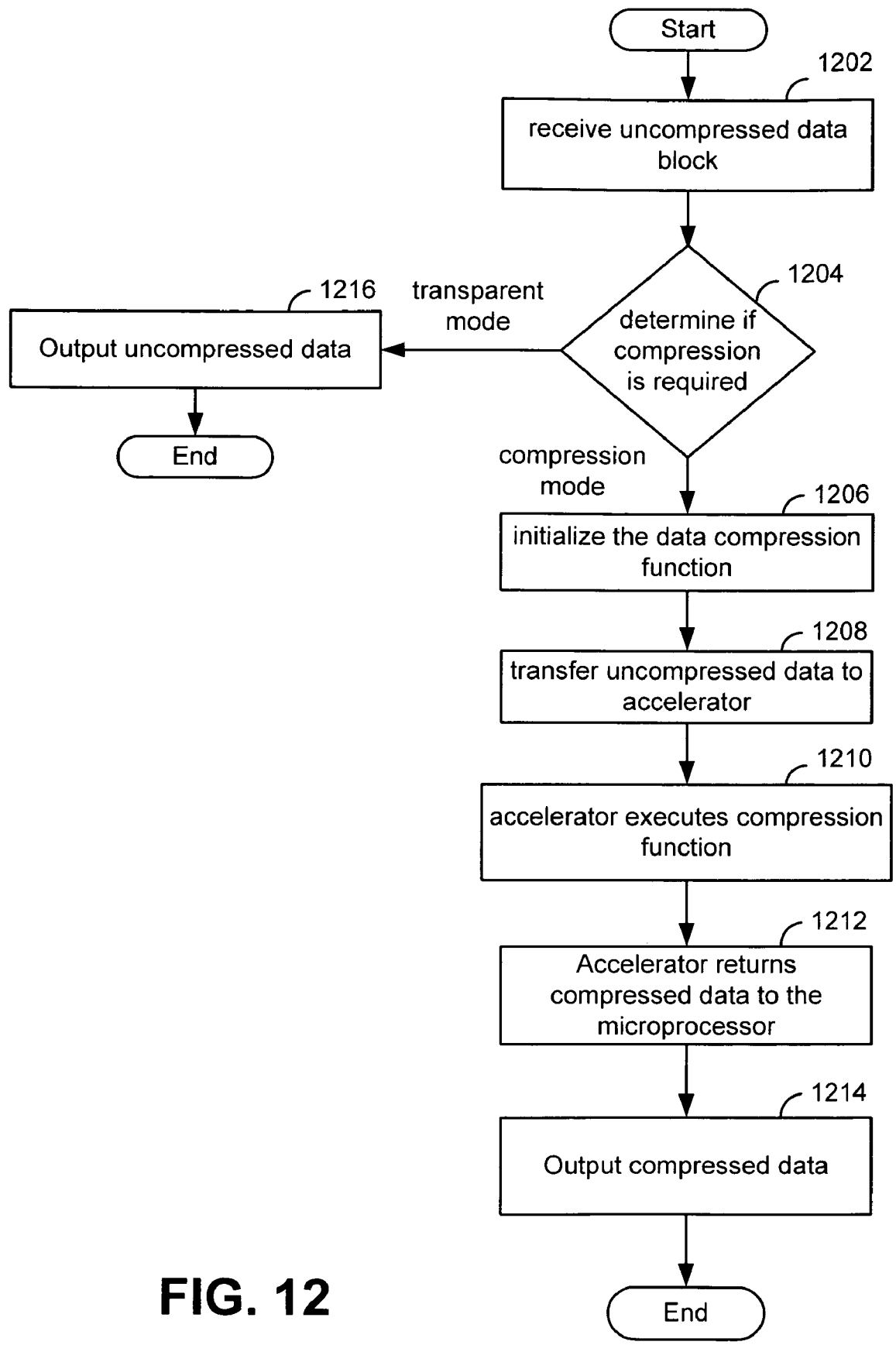
FIG. 12 provides a logical flow diagram indicating the control of process flows between the processor and accelerator when compressing V.42bis data.

FIG. 12 provides a logic flow diagram illustrating the control procedures within processing module 916 between the microprocessor and accelerator during compression of data. These operations begin with the processing module receiving an uncompressed data block in step 1202. The microprocessor determines if the data compression is required at decision point 1204. If compression is required, the microprocessor will initialize the data compression function in step 1206. This involves setting the appropriate compression parameters for the accelerator. These parameters configure the accelerator to operate in a predetermined way. Step 1208 transfers uncompressed data to the data compression functions within the accelerator. The accelerator executes the called functions corresponding to the compression parameters initialized in step 1206 within the dedicated accelerator hardware in step 1210. The results of this called function are then provided in an output accelerator register or designated memory location and returned as compressed data to the microprocessor in step 1212 which in turn outputs the compressed data from the processing module. Should compression not be required as determined at decision point 1204, the processing module operates in a transparent mode where the uncompressed data is the algorithms output as shown in step 1216. Concurrently the microprocessor of the processing module is free to perform other tasks and then retrieve the results. The encoder may then repeat these steps as needed.

Figure 13:
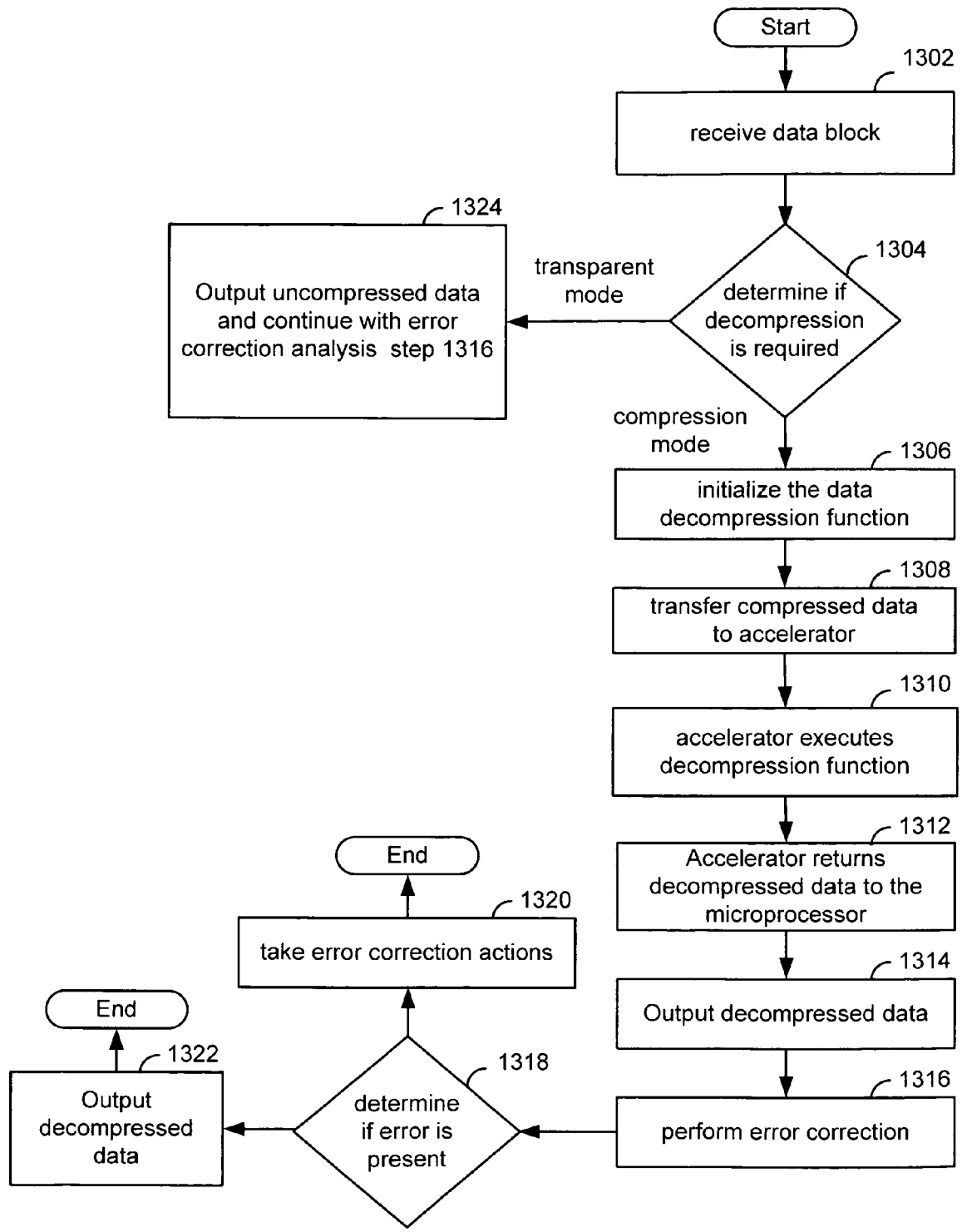
FIG. 13 provides a logical flow diagram indicating the control of process flows between the processor and accelerator when decompressing V.42bis data.

FIG. 13 provides a logic flow diagram illustrating the control procedures within processing module 916 between the microprocessor and accelerator during decompression of data. These operations begin with the processing module receiving a data block in step 1302. The microprocessor must analyze command codes within the data block to determine if the data block is compressed. The microprocessor makes this determination at decision point 1304. If decompression is required, the microprocessor will initialize the data decompression function in step 1306. This involves setting the appropriate decompression parameters for the accelerator. These parameters configure the accelerator to operate in a predetermined way. Step 1308 transfers the compressed data block to the data decompression functions within the accelerator. The accelerator executes the called functions corresponding to the decompression parameters initialized in step 1306 within the dedicated accelerator hardware in step 1310. The results of this called function are then provided in an output accelerator register or designated memory location and returned as decompressed data to the microprocessor in step 1312 which in turn outputs the compressed data from the processing module in step 1314. Should decompression not be required as determined at decision point 1304, the processing module operates in a transparent mode where the uncompressed data is the algorithms output as shown in step 1324. In either case, error correction analysis is performed in step 1316. This error correction analysis may be performed by either the microprocessor or accelerator. Should an error be indicated at decision point 1318, error corrections are taken in step 1320 prior to providing an output of the decompressed data. Otherwise, the decompressed data is directly outputted in step 1322. Concurrently the microprocessor of the processing module is free to perform other tasks and then retrieve the results. The encoder may then repeat these steps as needed.

Figure 14:
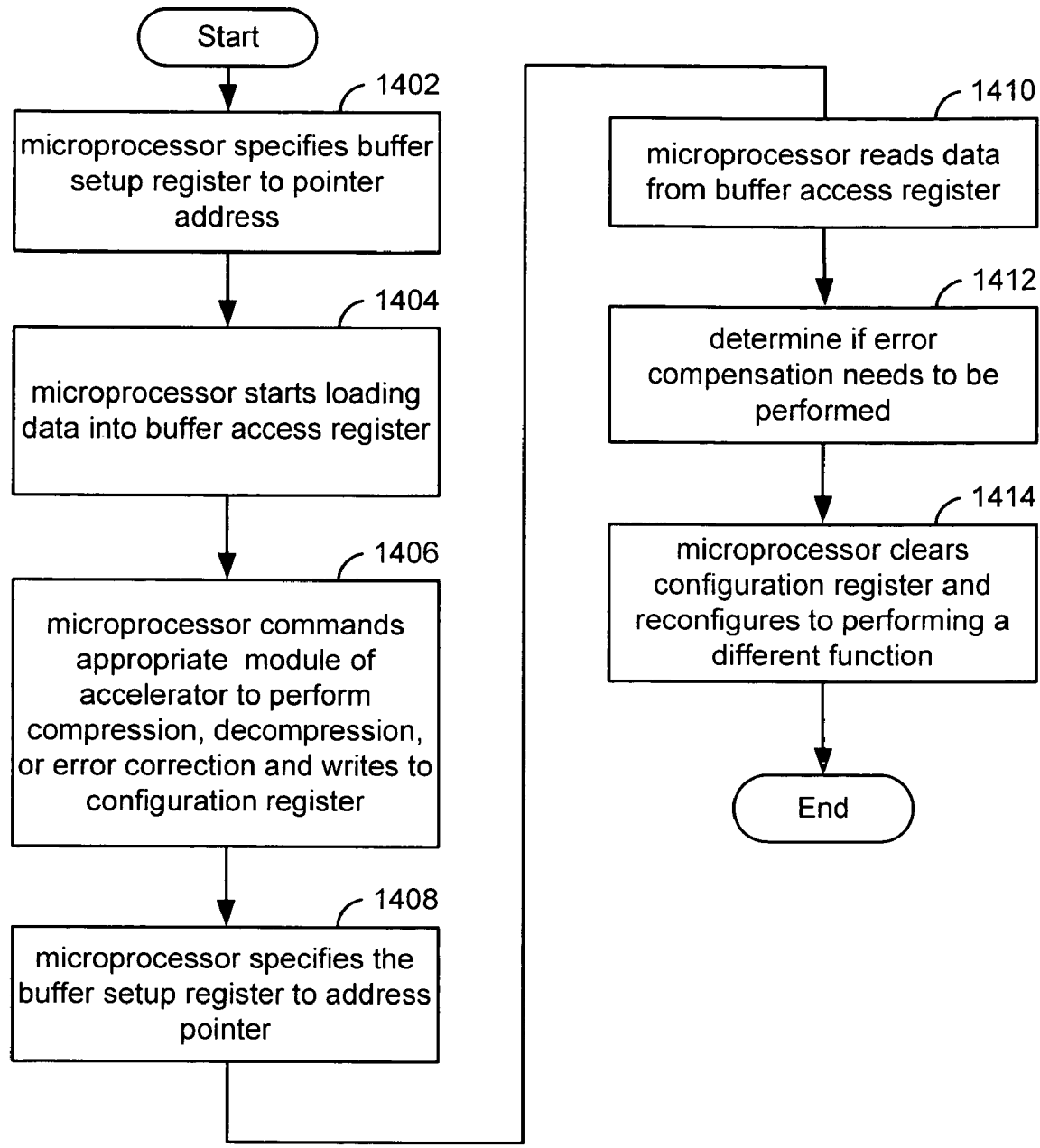
FIG. 14 provides a logical flow diagram indicating the control of process flows between the processor and accelerator when performing data compression, decompression and error correction.

As previously discussed, the accelerator module contains optimized hardware blocks for the acceleration of key compute intensive compression algorithms. These may be applied to many compression decompression standards and compute intensive portions of the error correction analysis. FIG. 14 provides a logic flow diagram illustrating the control procedures within the processing module between the microprocessor and accelerator during compression, decompression, and error correction of V.42bis Compression standard data. Here in step 1402, the microprocessor specifies the buffer setup register to the address pointer prior to loading data to the accelerator. In step 1404, the microprocessor begins to load data into the buffer access register. Then in step 1406, the microprocessor commands the appropriate module of the of the accelerator to perform compression, decompression, or error correction according to the specified compression standard by writing relevant parameters to the appropriate bit locations of the configuration register. Then in step 1408, the microprocessor specifies the buffer setup register to the address pointer prior to reading results from the accelerator. Then following the specification of the buffer setup register to the address pointer, the microprocessor begins to read data from the buffer access register in step 1410. This data will be passed for further compression, decompression, or error correction according to the specified compression standard. This information is stored and then used to determine if error compensation needs to be performed for the corresponding block in step 1412. Then the microprocessor clears the configuration register and reconfigures the configuration register to perform compression, decompression, or error correction according to the specified compression standard.

In summary, the present invention provides a processor within a wireless terminal operable to perform data compression, decompression and error correction according to a data compression protocol such as the V.42bis data compression protocol used within GSM wireless networks. This processor includes an interface that receives incoming information or data to be compressed or decompressed according to the data compression protocol. A processing module within the processor is operably coupled to the interface to receive and process the incoming information. Instructions executed within the processing module will divide the processing responsibilities between the processing module and a data compression/decompression accelerator operably coupled to the processing module. Compute intensive operations may be offloaded from the processing module onto the data compression/decompression accelerator to improve overall system efficiency. This combination allows the compute intensive operations to be offloaded from the processing module onto the accelerator in order to improve the overall system efficiency. Such a combination may overcome the shortcomings of prior devices by utilizing a distinct and dedicated hardware accelerator to support data compression, decompression and error correction within a wireless device.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A processor within a wireless terminal operable to perform data compression and decompression according to a data compression protocol, comprising:

an interface that receives incoming information to be compressed or decompressed according to the data compression protocol;

a processing module operably coupled to the interface;

a data compression/decompression accelerator module operably coupled to the processing module, wherein the data compression/decompression accelerator module includes state machines using a microcoded engine that is reprogrammable by reprogramming an instruction memory associated with the data compression/decompression accelerator module; and shared memory operably coupled to the processing module and to the data compression/decompression accelerator module, wherein:

the processing module is to store the information in the shared memory for retrieval by the data compression/decompression accelerator module and the processing module to generate an instruction to the data compression/decompression accelerator module that includes a pointer to point to the stored information, the instruction to identify a process to be performed to the stored information, and the instruction further includes multiple conditional branch targets and a fall-through target for the performed process;

the processing module and the data compression/decompression accelerator module are contained within a single Integrated Circuit (IC); and processing of the information to be compressed or decompressed according to the data compression protocol is performed by the data compression/decompression accelerator module as directed by the processing module and processed information is subsequently returned to the shared memory for retrieval by the processing module.

2. The processor of claim 1, wherein the data compression protocol comprises V.42bis Data Compression.

3. The processor of claim 2, wherein V.42bis Data Compression supports voice information.

4. The processor of claim 1, wherein the data compression/decompression accelerator module performs compute intensive operations.

5. The processor of claim 1, wherein the data compression/decompression accelerator module, when encoding and decoding information uses a dictionary size and string length.

6. The processor of claim 5, wherein the data compression/decompression accelerator module performs a Lempel, Ziv, and Welch (LZW) algorithm that substitutes a dictionary index for the phrase.

7. The processor of claim 1, wherein a mode of operation of the data compression/decompression accelerator module is directed by a control interface operably coupled to the data compression/decompression accelerator module.

8. The processor of claim 7, wherein the mode of operation comprises either a decode mode or an encode mode.

9. The processor of claim 7, wherein the control interface comprises:
a configuration register operably coupled to the processing module, wherein a state of the configuration register defines the mode of operation of the data compression/decompression accelerator module;
a buffer setup register; and
a buffer access register.

10. The processor of claim 9, wherein states of the buffer setup register define an address and format of data received by and outputted from the data compression/decompression accelerator module.

11. The processor of claim 10, wherein the data compression/decompression accelerator module writes/reads data to/from the buffer access register.

12. The processor of claim 1, wherein the wireless terminal operates according to the GSM standard.

13. A wireless terminal that comprises:
a Radio Frequency (RF) front end;
a baseband processor communicatively coupled to the RF front end that receives incoming information to be compressed or decompressed according to a data compression protocol;
a shared memory coupled to the baseband processor to store the information; and
a data compression/decompression accelerator module operably coupled to the baseband processor and the shared memory to perform compression or decompression operation on the stored information according to the data compression protocol, wherein the data compression/decompression accelerator module includes state machines using a microcoded engine that is reprogrammable by reprogramming an instruction memory associated with the data compression/decompression accelerator module, in which the baseband processor generates an instruction to the data compression/decompression accelerator module, wherein the instruction includes a pointer to be passed to the data compression/decompression accelerator module to point to the stored information, the instruction to identify a process to be performed to the stored information, and the instruction further includes multiple conditional branch targets and a fall-through target for the performed process, wherein upon completion of the compression or decompression operation, the data compression/decompression accelerator module returns compressed or decompressed information back to the shared memory for retrieval by the baseband processor.

14. The wireless terminal of claim 13, wherein the data compression protocol comprises V.42bis Data Compression.

15. The wireless terminal of claim 14, wherein V.42bis Data Compression supports voice information.

16. The wireless terminal of claim 13, wherein the data compression/decompression accelerator module performs compute intensive operations.

17. The wireless terminal of claim 13, wherein the data compression/decompression accelerator module, when encoding and decoding information uses a dictionary size and string length.

18. The wireless terminal of claim 13, wherein the data compression/decompression accelerator module performs a Lempel, Ziv, and Welch (LZW) algorithm that substitutes a dictionary index for the phrase.

19. The wireless terminal of claim 13, wherein a mode of operation of the data compression/decompression accelerator module is directed by a control interface operably coupled to the data compression/decompression accelerator module.

20. The wireless terminal of claim 19, wherein the mode of operation comprises either a decode mode or an encode mode.

21. The wireless terminal of claim 19, wherein the baseband processor includes a control interface that comprises:
a configuration register operably coupled to the processing module, wherein a state of the configuration register defines the mode of operation of the data compression/decompression accelerator module;
a buffer setup register; and
a buffer access register.

22. The wireless terminal of claim 21, wherein states of the buffer setup register define an address and format of data received by and outputted from the data compression/decompression accelerator module.

23. The wireless terminal of claim 22, wherein the data compression/decompression accelerator module writes/reads data to/from the buffer access register.

24. The wireless terminal of claim 13, wherein the wireless terminal operates according to the GSM standard.

25. A method to process information within a wireless terminal comprising:
receiving information at a processing engine;
determining if a compression or decompression operation is needed in the processing engine;
storing the information in a shared memory if compression or decompression operation is needed for retrieval of the information by a data compression/decompression accelerator module;
generating an instruction to the data compression/decompression accelerator module from the processing engine, in which the instruction includes a pointer to point to the stored information, the instruction to identify a process to be performed to the stored information, and the instruction further includes multiple conditional branch targets and a fall-through target to perform the process;

performing the compression or decompression operation in the data compression/decompression accelerator module that includes state machines using a microcoded engine that is reprogrammable by reprogramming an instruction memory associated with the data compression/decompression accelerator module;

storing the compressed or decompressed information in the shared memory; and retrieving the stored compressed or decompressed information by the processing engine.

26. The method of claim 25, wherein the data compression/decompression accelerator module performs compute intensive operations.

27. The method of claim 25, wherein the data compression/decompression accelerator module performs a Lempel, Ziv, and Welch (LZW) algorithm that substitutes a dictionary index for the phrase.

28. The method of claim 25, wherein a mode of operation of the data compression/decompression accelerator module is directed by a control interface operably coupled to the data compression/decompression accelerator module.

29. The method of claim 28, wherein the mode of operation comprises either a decode mode or an encode mode.

30. The method of claim 28, wherein the control interface comprises:

a configuration register operably coupled to the processing module, wherein a state of the configuration register defines the mode of operation of the data compression/decompression accelerator module;

a buffer setup register; and a buffer access register.

31. The method of claim 30, wherein:

states of the buffer setup register define an address and format of data received by and outputted from the data compression/decompression accelerator module, and the data compression/decompression accelerator module writes/reads data to/from the buffer access register.

32. The method of claim 25, wherein the wireless terminal operates according to the GSM standard.

* * * * *